(12) United States Patent
Araki et al.

(10) Patent No.: US 8,350,609 B2
(45) Date of Patent: Jan. 8, 2013

(54) SEMICONDUCTOR DEVICE

(75) Inventors: Masahiro Araki, Itami (JP); Atsuhiko Ishibashi, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 13/369,063

(22) Filed: Feb. 8, 2012

(65) Prior Publication Data

US 2012/0229197 A1 Sep. 13, 2012

(30) Foreign Application Priority Data

Mar. 20, 2011 (JP) ................................ 2011-048854

(51) Int. Cl.
*H03K 5/12* (2006.01)
(52) U.S. Cl. ...................................... 327/170; 327/109
(58) Field of Classification Search .................. None
See application file for complete search history.

(56) References Cited

U.S. PATENT DOCUMENTS

| | | | | |
|---|---|---|---|---|
| 6,275,077 B1* | 8/2001 | Tobin et al. | .................. | 327/108 |
| 7,345,504 B2* | 3/2008 | Lin et al. | .......................... | 326/30 |
| 7,501,853 B2 | 3/2009 | Ueda | | |
| 7,911,244 B2* | 3/2011 | Kikuchi et al. | ............... | 327/108 |
| 2005/0024084 A1* | 2/2005 | Hirata et al. | ..................... | 326/30 |
| 2009/0160496 A1* | 6/2009 | Takeuchi | ...................... | 327/108 |
| 2010/0308904 A1* | 12/2010 | Gicquel et al. | ............... | 327/563 |

FOREIGN PATENT DOCUMENTS

JP 2007-288737 11/2007

* cited by examiner

*Primary Examiner* — Cassandra Cox
(74) *Attorney, Agent, or Firm* — McDermott Will & Emery LLP

(57) ABSTRACT

The present invention provides a semiconductor device in which an adjustable range of a resistance value of a variable resistance circuit is large. The semiconductor device has an output buffer including a plurality of sets of resistance elements and a plurality of sets of transistors, a plurality of replica circuits, and a plurality of sets of operational amplifiers, and drain currents of the plurality of sets of transistors are adjusted so that output impedances of the output buffer become predetermined values. Therefore, even in the case where the resistance values of the resistance elements largely fluctuate due to fluctuations in manufacture process and the like, the output impedances can be set to predetermined values.

8 Claims, 20 Drawing Sheets

FIG. 2

| | REPLICA CIRCUIT RP1 | REPLICA CIRCUIT RP2 | REPLICA CIRCUIT RP3 |
|---|---|---|---|
| WHEN COMBINED RESISTANCE VALUE OF RA1 TO RA4 AND P4 IS HIGHER THAN PREDETERMINED VALUE AND COMBINED RESISTANCE VALUE OF RA2 TO RA4 AND P4 IS LOWER THAN PREDETERMINED VALUE | VFP1 = VRP<br>VP1 IS INTERMEDIATE VOLTAGE<br>(DRAIN CURRENT OF P1 IS ADJUSTED) | VFP2 = VRP<br>VP2 IS HIGHEST VOLTAGE | VFP3 = VRP<br>VP3 IS HIGHEST VOLTAGE |
| WHEN COMBINED RESISTANCE VALUE OF RA2 TO RA4 AND P4 IS HIGHER THAN PREDETERMINED VALUE AND COMBINED RESISTANCE VALUE OF RA3, RA4, AND P4 IS LOWER THAN PREDETERMINED VALUE | VFP1 < VRP<br>VP1 IS LOWEST VOLTAGE | VFP2 = VRP<br>VP2 IS INTERMEDIATE VOLTAGE<br>(DRAIN CURRENT OF P2 IS ADJUSTED) | VFP3 = VRP<br>VP3 IS HIGHEST VOLTAGE |
| WHEN COMBINED RESISTANCE VALUE OF RA3, RA4, AND P4 IS HIGHER THAN PREDETERMINED VALUE AND COMBINED RESISTANCE VALUE OF RA4 AND P4 IS LOWER THAN PREDETERMINED VALUE | VFP1 < VRP<br>VP1 IS LOWEST VOLTAGE | VFP2 < VRP<br>VP2 IS LOWEST VOLTAGE | VFP3 = VRP<br>VP3 IS INTERMEDIATE VOLTAGE<br>(DRAIN CURRENT OF P3 IS ADJUSTED) |

FIG. 3

| | REPLICA CIRCUIT RP1 | REPLICA CIRCUIT RP2 | REPLICA CIRCUIT RP3 |
|---|---|---|---|
| WHEN COMBINED RESISTANCE VALUE OF RB1 TO RB4 AND Q4 IS HIGHER THAN PREDETERMINED VALUE AND COMBINED RESISTANCE VALUE OF RB2 TO RB4 AND Q4 IS LOWER THAN PREDETERMINED VALUE | VFN1 = VRN VN1 IS INTERMEDIATE VOLTAGE (DRAIN CURRENT OF Q1 IS ADJUSTED) | VFN2 = VRN VN2 IS LOWEST VOLTAGE | VFN3 = VRN VN3 IS LOWEST VOLTAGE |
| WHEN COMBINED RESISTANCE VALUE OF RB2 TO RB4 AND Q4 IS HIGHER THAN PREDETERMINED VALUE AND COMBINED RESISTANCE VALUE OF RB3, RB4, AND Q4 IS LOWER THAN PREDETERMINED VALUE | VFN1 > VRN VN1 IS HIGHEST VOLTAGE | VFN2 = VRN VN2 IS INTERMEDIATE VOLTAGE (DRAIN CURRENT OF Q2 IS ADJUSTED) | VFN3 = VRN VN3 IS LOWEST VOLTAGE |
| WHEN COMBINED RESISTANCE VALUE OF RB3, RB4, AND Q4 IS HIGHER THAN PREDETERMINED VALUE AND COMBINED RESISTANCE VALUE OF RB4 AND Q4 IS LOWER THAN PREDETERMINED VALUE | VFN1 > VRN VN1 IS HIGHEST VOLTAGE | VFN2 > VRN VN2 IS HIGHEST VOLTAGE | VFN3 = VRN VN3 IS INTERMEDIATE VOLTAGE (DRAIN CURRENT OF Q3 IS ADJUSTED) |

FIG. 8

|  | REPLICA CIRCUIT RP11 | REPLICA CIRCUIT RP12 | REPLICA CIRCUIT RP13 |
|---|---|---|---|
| WHEN COMBINED RESISTANCE VALUE OF RB1 TO RB4 AND Q4 IS HIGHER THAN PREDETERMINED VALUE AND COMBINED RESISTANCE VALUE OF RB2 TO RB4 AND Q4 IS LOWER THAN PREDETERMINED VALUE | VFN1 = VRN VN1 IS INTERMEDIATE VOLTAGE (DRAIN CURRENT OF Q1 IS ADJUSTED) | VFN2 = VRN VN2 IS LOWEST VOLTAGE | VFN3 = VRN VN3 IS LOWEST VOLTAGE |
| WHEN COMBINED RESISTANCE VALUE OF RB2 TO RB4 AND Q4 IS HIGHER THAN PREDETERMINED VALUE AND COMBINED RESISTANCE VALUE OF RB3, RB4, AND Q4 IS LOWER THAN PREDETERMINED VALUE | VFN1 > VRN VN1 IS HIGHEST VOLTAGE | VFN2 = VRN VN2 IS INTERMEDIATE VOLTAGE (DRAIN CURRENT OF Q2 IS ADJUSTED) | VFN3 = VRN VN3 IS LOWEST VOLTAGE |
| WHEN COMBINED RESISTANCE VALUE OF RB3, RB4, AND Q4 IS HIGHER THAN PREDETERMINED VALUE AND COMBINED RESISTANCE VALUE OF RB4 AND Q4 IS LOWER THAN PREDETERMINED VALUE | VFN1 > VRN VN1 IS HIGHEST VOLTAGE | VFN2 > VRN VN2 IS HIGHEST VOLTAGE | VFN3 = VRN VN3 IS INTERMEDIATE VOLTAGE (DRAIN CURRENT OF Q3 IS ADJUSTED) |

FIG. 11

| | REPLICA CIRCUIT RP1 | REPLICA CIRCUIT RP2 | REPLICA CIRCUIT RP3 |
|---|---|---|---|
| WHEN COMBINED RESISTANCE VALUE OF RA1 TO RA4 AND P4 IS HIGHER THAN PREDETERMINED VALUE AND COMBINED RESISTANCE VALUE OF RA2 TO RA4 AND P4 IS LOWER THAN PREDETERMINED VALUE | VFP1 = VRP<br>VP1 IS INTERMEDIATE VOLTAGE<br>(DRAIN CURRENT OF P1 IS ADJUSTED) | QS IS OFF.<br>VFP2 = VDD<br>VP2 IS HIGHEST VOLTAGE | QS IS OFF.<br>VFP3 = VDD<br>VP3 IS HIGHEST VOLTAGE |
| WHEN COMBINED RESISTANCE VALUE OF RA2 TO RA4 AND P4 IS HIGHER THAN PREDETERMINED VALUE AND COMBINED RESISTANCE VALUE OF RA3, RA4, AND P4 IS LOWER THAN PREDETERMINED VALUE | VFP1 < VRP<br>VP1 IS LOWEST VOLTAGE | QS IS ON.<br>VFP2 = VRP<br>VP2 IS INTERMEDIATE VOLTAGE<br>(DRAIN CURRENT OF P2 IS ADJUSTED) | QS IS OFF.<br>VFP3 = VDD<br>VP3 IS HIGHEST VOLTAGE |
| WHEN COMBINED RESISTANCE VALUE OF RA3, RA4, AND P4 IS HIGHER THAN PREDETERMINED VALUE AND COMBINED RESISTANCE VALUE OF RA4 AND P4 IS LOWER THAN PREDETERMINED VALUE | VFP1 < VRP<br>VP1 IS LOWEST VOLTAGE | QS IS ON.<br>VFP2 < VRP<br>VP2 IS LOWEST VOLTAGE | QS IS ON.<br>VFP3 = VRP<br>VP3 IS INTERMEDIATE VOLTAGE<br>(DRAIN CURRENT OF P3 IS ADJUSTED) |

FIG. 12

| | REPLICA CIRCUIT RP1 | REPLICA CIRCUIT RP2 | REPLICA CIRCUIT RP3 |
|---|---|---|---|
| WHEN COMBINED RESISTANCE VALUE OF RB1 TO RB4 AND Q4 IS HIGHER THAN PREDETERMINED VALUE AND COMBINED RESISTANCE VALUE OF RB2 TO RB4 AND Q4 IS LOWER THAN PREDETERMINED VALUE | VFN1 = VRN<br>VN1 IS INTERMEDIATE VOLTAGE<br>(DRAIN CURRENT OF Q1 IS ADJUSTED) | PS IS OFF.<br>VFN2 = VSS<br>VN2 IS LOWEST VOLTAGE | PS IS OFF.<br>VFN3 = VSS<br>VN3 IS LOWEST VOLTAGE |
| WHEN COMBINED RESISTANCE VALUE OF RB2 TO RB4 AND Q4 IS HIGHER THAN PREDETERMINED VALUE AND COMBINED RESISTANCE VALUE OF RB3, RB4, AND Q4 IS LOWER THAN PREDETERMINED VALUE | VFN1 > VRN<br>VN1 IS HIGHEST VOLTAGE | PS IS ON.<br>VFN2 = VRN<br>VN2 IS INTERMEDIATE VOLTAGE<br>(DRAIN CURRENT OF Q2 IS ADJUSTED) | PS IS OFF.<br>VFN3 = VSS<br>VN3 IS LOWEST VOLTAGE |
| WHEN COMBINED RESISTANCE VALUE OF RB3, RB4, AND Q4 IS HIGHER THAN PREDETERMINED VALUE AND COMBINED RESISTANCE VALUE OF RB4 AND Q4 IS LOWER THAN PREDETERMINED VALUE | VFN1 > VRN<br>VN1 IS HIGHEST VOLTAGE | PS IS ON.<br>VFN2 > VRN<br>VN2 IS HIGHEST VOLTAGE | PS IS ON.<br>VFN3 = VRN<br>VN3 IS INTERMEDIATE VOLTAGE<br>(DRAIN CURRENT OF Q3 IS ADJUSTED) |

FIG. 15

| | REPLICA CIRCUIT RP11 | REPLICA CIRCUIT RP12 | REPLICA CIRCUIT RP13 |
|---|---|---|---|
| WHEN COMBINED RESISTANCE VALUE OF RB1 TO RB4 AND Q4 IS HIGHER THAN PREDETERMINED VALUE AND COMBINED RESISTANCE VALUE OF RB2 TO RB4 AND Q4 IS LOWER THAN PREDETERMINED VALUE | VFN1 = VRN<br>VN1 IS INTERMEDIATE VOLTAGE<br>(DRAIN CURRENT OF Q1 IS ADJUSTED) | PS IS OFF.<br>VFN2 = VSS<br>VN2 IS LOWEST VOLTAGE | PS IS OFF.<br>VFN3 = VSS<br>VN3 IS LOWEST VOLTAGE |
| WHEN COMBINED RESISTANCE VALUE OF RB2 TO RB4 AND Q4 IS HIGHER THAN PREDETERMINED VALUE AND COMBINED RESISTANCE VALUE OF RB3, RB4, AND Q4 IS LOWER THAN PREDETERMINED VALUE | VFN1 > VRN<br>VN1 IS HIGHEST VOLTAGE | PS IS ON.<br>VFN2 = VRN<br>VN2 IS INTERMEDIATE VOLTAGE<br>(DRAIN CURRENT OF Q2 IS ADJUSTED) | PS IS OFF.<br>VFN3 = VSS<br>VN3 IS LOWEST VOLTAGE |
| WHEN COMBINED RESISTANCE VALUE OF RB3, RB4, AND Q4 IS HIGHER THAN PREDETERMINED VALUE AND COMBINED RESISTANCE VALUE OF RB4 AND Q4 IS LOWER THAN PREDETERMINED VALUE | VFN1 > VRN<br>VN1 IS HIGHEST VOLTAGE | PS IS ON.<br>VFN2 > VRN<br>VN2 IS HIGHEST VOLTAGE | PS IS ON.<br>VFN3 = VRN<br>VN3 IS INTERMEDIATE VOLTAGE<br>(DRAIN CURRENT OF Q3 IS ADJUSTED) |

FIG. 18

| | REPLICA CIRCUIT RP1 | REPLICA CIRCUIT RP2 | REPLICA CIRCUIT RP3 |
|---|---|---|---|
| WHEN COMBINED RESISTANCE VALUE OF RA1 TO RA4 AND P4 IS HIGHER THAN PREDETERMINED VALUE AND COMBINED RESISTANCE VALUE OF RA2 TO RA4 AND P4 IS LOWER THAN PREDETERMINED VALUE | P4 IS ON. VFP1 = VRP VP1 IS INTERMEDIATE VOLTAGE (DRAIN CURRENT OF P1 IS ADJUSTED) | P4 IS ON. VFP2 = VRP VP2 IS HIGHEST VOLTAGE | P4 IS ON. VFP3 = VRP VP3 IS HIGHEST VOLTAGE |
| WHEN COMBINED RESISTANCE VALUE OF RA2 TO RA4 AND P4 IS HIGHER THAN PREDETERMINED VALUE AND COMBINED RESISTANCE VALUE OF RA3, RA4, AND P4 IS LOWER THAN PREDETERMINED VALUE | P4 IS OFF. VFP1 = VSS VP1 IS LOWEST VOLTAGE | P4 IS ON. VFP2 = VRP VP2 IS INTERMEDIATE VOLTAGE (DRAIN CURRENT OF P2 IS ADJUSTED) | P4 IS ON. VFP3 = VRP VP3 IS HIGHEST VOLTAGE |
| WHEN COMBINED RESISTANCE VALUE OF RA3, RA4, AND P4 IS HIGHER THAN PREDETERMINED VALUE AND COMBINED RESISTANCE VALUE OF RA4 AND P4 IS LOWER THAN PREDETERMINED VALUE | P4 IS OFF. VFP1 = VSS VP1 IS LOWEST VOLTAGE | P4 IS OFF. VFP2 = VSS VP2 IS LOWEST VOLTAGE | P4 IS ON. VFP3 = VRP VP3 IS INTERMEDIATE VOLTAGE (DRAIN CURRENT OF P3 IS ADJUSTED) |

FIG. 19

|  | REPLICA CIRCUIT RP1 | REPLICA CIRCUIT RP2 | REPLICA CIRCUIT RP3 |
|---|---|---|---|
| WHEN COMBINED RESISTANCE VALUE OF RB1 TO RB4 AND Q4 IS HIGHER THAN PREDETERMINED VALUE AND COMBINED RESISTANCE VALUE OF RB2 TO RB4 AND Q4 IS LOWER THAN PREDETERMINED VALUE | Q4 IS ON. VFN1 = VRN VN1 IS INTERMEDIATE VOLTAGE (DRAIN CURRENT OF Q1 IS ADJUSTED) | Q4 IS ON. VFN2 = VRN VN2 IS LOWEST VOLTAGE | Q4 IS ON. VFN3 = VRN VN3 IS LOWEST VOLTAGE |
| WHEN COMBINED RESISTANCE VALUE OF RB2 TO RB4 AND Q4 IS HIGHER THAN PREDETERMINED VALUE AND COMBINED RESISTANCE VALUE OF RB3, RB4, AND Q4 IS LOWER THAN PREDETERMINED VALUE | Q4 IS OFF. VFN1 = VDD VN1 IS HIGHEST VOLTAGE | Q4 IS ON. VFN2 = VRN VN2 IS INTERMEDIATE VOLTAGE (DRAIN CURRENT OF Q2 IS ADJUSTED) | Q4 IS ON. VFN3 = VRN VN3 IS LOWEST VOLTAGE |
| WHEN COMBINED RESISTANCE VALUE OF RB3, RB4, AND Q4 IS HIGHER THAN PREDETERMINED VALUE AND COMBINED RESISTANCE VALUE OF RB4 AND Q4 IS LOWER THAN PREDETERMINED VALUE | Q4 IS OFF. VFN1 = VDD VN1 IS HIGHEST VOLTAGE | Q4 IS OFF. VFN2 = VDD VN2 IS HIGHEST VOLTAGE | Q4 IS ON. VFN3 = VRN VN3 IS INTERMEDIATE VOLTAGE (DRAIN CURRENT OF Q3 IS ADJUSTED) |

SEMICONDUCTOR DEVICE

CROSS-REFERENCE TO RELATED APPLICATIONS

The disclosure of Japanese Patent Application No. 2011-48854 filed on Mar. 7, 2011 including the specification, drawings and abstract is incorporated herein by reference in its entirety.

BACKGROUND

The present invention relates to a semiconductor device and, more particularly, relates to a semiconductor device having a variable resistance circuit.

A related-art semiconductor device has a variable resistance circuit (terminating resistance element) including a first resistance element and a first transistor coupled in parallel, a replica circuit including a second resistance element and a second transistor coupled in parallel, a constant current source for passing constant current to the replica circuit, and an operational amplifier controlling gate voltage of the first and second transistors so that voltage across the terminals of the replica circuit becomes predetermined voltage. In the semiconductor device, even in the case where the resistance value of the resistance element fluctuates due to fluctuations in manufacture process and temperature, the resistance value of the variable resistance circuit can be set to a predetermined value (refer to, for example, patent literature 1).

RELATED-ART LITERATURE

Patent Literature

[Patent Literature 1]
Japanese Unexamined Patent Publication No. 2007-288737

SUMMARY

However, in a related-art semiconductor device, an adjustable range of a resistance value of a variable resistance circuit is small. Consequently, in the case where the resistance value of the resistance element largely fluctuates due to fluctuations in the manufacture process and temperature, a problem occurs such that the resistance value of the variable resistance circuit cannot be set to a predetermined value.

A main object of the present invention is therefore to provide a semiconductor device in which an adjustable range of the resistance value of a variable resistance circuit is large.

A semiconductor device according to the present invention has a variable resistance circuit, first to M-th replica circuits (where M is an integer of 2 or larger), and operational amplifiers each provided in correspondence with each of the replica circuits. Each of the variable resistance circuit and the first to M-th replica circuits includes first to M-th resistance elements coupled in series between a first voltage line and a predetermined node, and first to M-th transistors provided in correspondence with the first to M-th resistance elements, respectively, and each coupled between the first voltage line and an electrode on the predetermined node side of a corresponding resistance element. Each of the first to M-th replica circuits further includes a constant current source coupled between the predetermined node and a second voltage line and passing predetermined constant current. Each of (m+1)th to M-th transistors of the m-th replica circuit (where m is any integer from 1 to M−1) is fixed in a non-conductive state. Gates of a plurality of k-th transistors which are not fixed in the non-conductive state out of k-th transistors (where k is any integer from 1 to M) of M+1 pieces included in the variable resistance circuit and the first to M-th replica circuits are coupled to one another. The operational amplifier controls the gate voltage of the k-th transistor of a corresponding to k-th replica circuit so that voltage of the predetermined node of the corresponding k-th replica circuit becomes predetermined reference voltage.

In the semiconductor device according to the present invention, the variable resistance circuit is formed by M sets of resistance elements and transistors, and the gate voltage of M pieces of transistors is controlled by M sets of replica circuits and operational amplifiers. Consequently, the adjustable range of the resistance value of the variable resistance circuit can be made wider than that in the related-art technique.

BRIEF DESCRIPTION OF THE DRAWINGS

FIG. 2 is a diagram illustrating the operation of the semiconductor device shown in FIG. 1.

FIG. 3 is another diagram illustrating the operation of the semiconductor device shown in FIG. 1.

FIG. 8 is a diagram of the operation of the semiconductor device illustrated in FIG. 7.

FIG. 11 is a diagram showing the operation of the semiconductor device illustrated in FIG. 10.

FIG. 12 is another diagram showing the operation of the semiconductor device illustrated in FIG. 10.

FIG. 15 is a diagram illustrating the operation of the semiconductor device shown in FIG. 14.

FIG. 18 is a diagram illustrating the operation of the semiconductor device shown in FIG. 17.

FIG. 19 is another diagram illustrating the operation of the semiconductor device shown in FIG. 17.

DETAILED DESCRIPTION

First Embodiment

Figure 1:
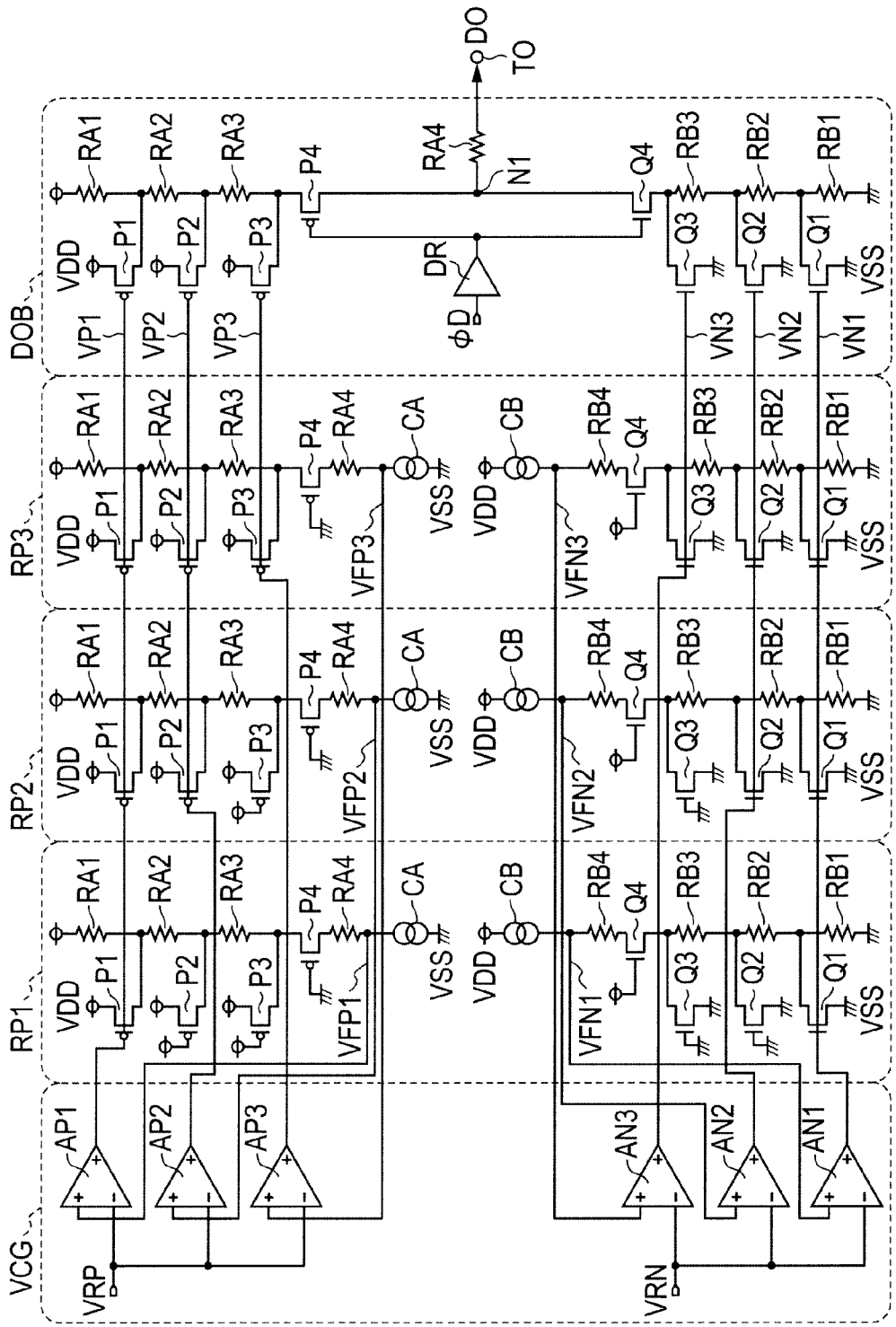
FIG. 1 is a circuit diagram illustrating the configuration of a semiconductor device according to a first embodiment of the present invention.

A semiconductor device according to a first embodiment of the present invention has, as illustrated in FIG. 1, a control voltage generation circuit VCG, replica circuits RP1 to RP3, an output buffer DOB, and an output terminal TO. The output buffer DOB is configured as a full-speed driver circuit of a USB (Universe Serial Bus) and includes resistance elements RA1 to RA4 and RB1 to RB3, P-channel MOS transistors P1 to P4, N-channel MOS transistors Q1 to Q4, and a driver DR.

The resistance elements RA1 to RA3, the P-channel MOS transistor P4, and the resistance element RA4 are coupled in series between a line of power supply voltage VDD and the output terminal TO. The sources of the P-channel MOS transistors P1 to P3 receive the power supply voltage VDD, and the drains are coupled to electrodes on the lower voltage side (the output terminal TO side) of the resistance elements RA1 to RA4.

The resistance elements RB1 to RB3 and the N-channel MOS transistor Q4 are coupled in series between the line of the ground voltage VSS and the drain of the P-channel MOS transistor P4. The sources of the N-channel MOS transistors Q1 to Q3 receive the ground voltage VSS, and the drains are coupled to electrodes on the higher voltage side (the output terminal TO side) of the resistance elements RB1 to RB3. The gates of the transistors P4 and Q4 are coupled to each other. The driver DR transmits an internal data signal φD to the gates of the transistors P4 and Q4.

Each of the replica circuits RP1 to RP3 is a replica of the output buffer DOB and includes the resistance elements RA1 to RA4 and RB1 to RB4, the P-channel MOS transistors P1 to P4, the N-channel MOS transistors Q1 to Q4, and the constant current sources CA and CB. The resistance elements RA1 to RA4 and RB1 to RB3 of the replica circuits RP1 to RP3 have the same resistance values as those of the resistance elements RA1 to RA4 and RB1 to RB3 of the output buffer DOB, respectively. The resistance element RB4 in each of the replica circuits RP1 to RP3 has the same resistance value as that of the resistance element RA4 of the output buffer DOB.

The P-channel MOS transistors P1 to P4 and the N-channel MOS transistors Q1 to Q4 in each of the replica circuits RP1 to RP3 have the same sizes (current drive capability) as those of the P-channel MOS transistors P1 to P4 and the N-channel MOS transistors Q1 to Q4 of the output buffer DOB.

When the P-channel MOS transistor P4 is turned on, the constant current source CA in each of the replica circuits RP1 to RP3 passes current having the same value as that of current which flows from the output buffer DOB to the outside via the output terminal TO. When the N-channel MOS transistor Q4 of the output buffer DOB is turned on, The constant current source CB in each of the replica circuits RP1 to RP3 passes current having the same value as that of current which flows from the outside to the output buffer DOB via the output terminal TO.

In each of the replica circuits RP1 to RP3, the resistance elements RA1 to RA3, the P-channel MOS transistor P4, the resistance element RA4, and the constant current source CA are coupled in series between the line of the power supply voltage VDD and the line of the ground voltage VSS. The sources of the P-channel MOS transistors P1 to P3 receive the power supply voltage VDD, and the drains are coupled to electrodes on the lower voltage side (the ground voltage VSS side) of the resistance elements RA1 to RA4. The gate of the P-channel MOS transistor P4 receives the ground voltage VSS. The P-channel MOS transistor P4 operates as a resistance element.

The resistance elements RB1 to RB3, the N-channel MOS transistor Q4, the resistance element RB4, and the constant current source CB are coupled in series between the line of the ground voltage VSS and the line of the power supply voltage VDD. The sources of the N-channel MOS transistors Q1 to Q3 receive the ground voltage VSS, and the drains are coupled to electrodes on the higher voltage side (the power supply voltage VDD side) of the resistance elements RB1 to RB3. The gate of the N-channel MOS transistor Q4 receives the power supply voltage VDD. The N-channel MOS transistor Q4 operates as a resistance element.

Voltages VFP1 to VFP3 between the resistance elements RA4 in the replica circuits RP1 to RP3 and the constant current sources CA are fed back to the control voltage generation circuit VCG. Voltages VFN1 to VFN3 between the resistance elements RB4 in the replica circuits RP1 to RP3 and the constant current sources CB are fed back to the control voltage generation circuit VCG.

The control voltage generation circuit VCG includes operational amplifiers AP1 to AP3 and AN1 to AN3. The inversion input terminals (− terminals) of the operational amplifiers AP1 to AP3 receive a reference voltage VRP and non-inversion input terminals (+ terminals) receive the output voltages VFP1 to VFP3 of the replica circuits RP1 to RP3.

The output terminal of the operational amplifier AP1 is coupled to the gates of the P-channel MOS transistors P1 in the replica circuits RP1 to RP3 and the output buffer DOB. The operational amplifier AP1 controls the gate voltage VP1 of the P-channel MOS transistors P1 in the replica circuits RP1 to RP3 and the output buffer DOB so that the output voltage VFP1 of the replica circuit RP1 matches the reference voltage VRP.

The output terminal of the operational amplifier AP2 is coupled to the gates of the P-channel MOS transistors P2 in the replica circuits RP2 and RP3 and the output buffer DOB. The operational amplifier AP2 controls the gate voltage VP2 of the P-channel MOS transistors P2 in the replica circuits RP2 and RP3 and the output buffer DOB so that the output voltage VFP2 of the replica circuit RP2 matches the reference voltage VRP. The P-channel MOS transistor P2 in the replica circuit RP1 receives the power supply voltage VDD by its gate and is fixed in the non-conductive state.

The output terminal of the operational amplifier AP3 is coupled to the gates of the P-channel MOS transistors P3 in the replica circuit RP3 and the output buffer DOB. The operational amplifier AP3 controls the gate voltage VP3 of the P-channel MOS transistors P3 in the replica circuit RP3 and the output buffer DOB so that the output voltage VFP3 of the replica circuit RP3 matches the reference voltage VRP. The P-channel MOS transistor P3 in each of the replica circuits RP1 and RP2 receives the power supply voltage VDD by its gate and is fixed in the non-conductive state.

The inversion input terminals (− terminals) of the operational amplifiers AN1 to AN3 receive a reference voltage VRN and non-inversion input terminals (+ terminals) receive the output voltages VFN1 to VFN3 of the replica circuits RP1 to RP3.

The output terminal of the operational amplifier AN1 is coupled to the gates of the N-channel MOS transistors Q1 in the replica circuits RP1 to RP3 and the output buffer DOB. The operational amplifier AN1 controls the gate voltage VN1 of the N-channel MOS transistors Q1 in the replica circuits RP1 to RP3 and the output buffer DOB so that the output voltage VFN1 of the replica circuit RP1 matches the reference voltage VRN.

The output terminal of the operational amplifier AN2 is coupled to the gates of the N-channel MOS transistors Q2 in the replica circuits RP2 and RP3 and the output buffer DOB. The operational amplifier AN2 controls the gate voltage VN2 of the N-channel MOS transistors Q2 in the replica circuits RP2 and RP3 and the output buffer DOB so that the output voltage VFN2 of the replica circuit RP2 matches the reference voltage VRN. The N-channel MOS transistor Q2 in the replica circuit RP1 receives the ground voltage VSS by its gate and is fixed in the non-conductive state.

The output terminal of the operational amplifier AN3 is coupled to the gates of the N-channel MOS transistors P3 in the replica circuit RP3 and the output buffer DOB. The operational amplifier AN3 controls the gate voltage VN3 of the N-channel MOS transistors Q3 in the replica circuit RP3 and the output buffer DOB so that the output voltage VFP3 of the replica circuit RP3 matches the reference voltage VRN. The N-channel MOS transistor Q3 in each of the replica circuits RP1 and RP2 receives the ground voltage VSS by its gate and is fixed in the non-conductive state.

Next, the operation of the semiconductor device will be described. The operational amplifiers AP1 to AP3 control the gate voltages VP1 to VP3 of the P-channel MOS transistors P1 to P3 so that the output voltages VFP1 to VFP3 of the replica circuits RP1 to RP3 become equal to the reference voltage VRP in accordance with the value of combined resistance of the resistance elements RA1 to RA3 and the P-channel MOS transistor P4.

If the output voltage VFP1 of the replica circuit RP1 becomes equal to the reference voltage VRP, the resistance characteristic determined by (VDD−VRP)/ICA is obtained by the gate voltage VP1. ICA denotes the current value of the constant current source CA. Since the output voltages VFP2 and VFP3 of the replica circuits RP2 and RP3 are also controlled to be equal to the reference voltage VRP by the gate voltage VP1, the gate voltages VP2 and VP3 become the highest voltage (power supply voltage VDD) and function to turn off the P-channel MOS transistors P2 and P3.

On the other hand, when the output voltage VFP1 of the replica circuit RP1 does not become equal to the reference voltage VRP, the gate voltage VP1 becomes the lowest voltage (ground voltage VSS), and the drain current of the P-channel MOS transistor P1 is maximized. Further, if the output voltage VFP2 of the replica circuit RP2 does not become equal to the reference voltage VRP, the gate voltage VP2 becomes the lowest voltage, and the drain current of the P-channel MOS transistor P2 is also maximized. In this state, for example, if the output voltage VFP3 of the replica circuit RP3 does not become equal to the reference voltage VRP, the resistance characteristic determined by (VDD−VRP)/ICA is obtained by the gate voltage VP3.

Since the gate voltages VP1 to VP3 also control the P-channel MOS transistors VP1 to VP3 of the output buffer DOB, an output impedance Zp at the time when the output buffer DOB outputs the "H" level is adjusted to have the resistance characteristic determined by (VDD−VRP)/ICA.

Concretely, as illustrated in the upper row in FIG. 2, when the combined resistance value of the resistance elements RA1 to RA4 and the P-channel MOS transistor P4 is higher than a predetermined value and the combined resistance value of the resistance elements RA2 to RA4 and the P-channel MOS transistor P4 is lower than the predetermined value, all of the output voltages VFP1 to VFP3 of the replica circuits RP1 to RP3 become equal to the reference voltage VRP.

The gate voltage VP1 becomes intermediate voltage, and both of the gate voltages VP2 and VP3 become the highest voltage. As a result, the drain current of the P-channel MOS transistor P1 is adjusted to a proper value, the P-channel MOS transistors P2 and P3 are turned off, and the combined resistance value of the resistance elements RA1 to RA4 and the P-channel MOS transistors P1 to P4 of the output buffer DOB is adjusted to a predetermined value.

As illustrated in the intermediate row in FIG. 2, when the combined resistance value of the resistance elements RA2 to RA4 and the P-channel MOS transistor P4 is higher than a predetermined value and the combined resistance value of the resistance elements RA3 and RA4 and the P-channel MOS transistor P4 is lower than the predetermined value, the output voltage VFP1 of the replica circuit RP1 becomes lower than the reference voltage VRP, and both of the output voltages VFP2 and VFP3 of the replica circuits RP2 and RP3 become equal to the reference voltage VRP.

The gate voltage VP1 becomes the lowest voltage, the gate voltage VP2 becomes the intermediate voltage, and the gate voltage VP3 becomes the highest voltage. As a result, the P-channel MOS transistor P1 is turned on, the drain current of the P-channel MOS transistor P2 is adjusted to a proper value, the P-channel MOS transistor P3 is turned off, and the combined resistance value of the resistance elements RA1 to RA4 and the P-channel MOS transistors P1 to P4 of the output buffer DOB is adjusted to a predetermined value.

As illustrated in the lower row in FIG. 2, when the combined resistance value of the resistance elements RA2 to RA4 and the P-channel MOS transistor P4 is higher than a predetermined value and the combined resistance value of the resistance element RA4 and the P-channel MOS transistor P4 is lower than the predetermined value, both of the output voltages VFP1 and VFP2 of the replica circuits RP1 and RP2 become lower than the reference voltage VRP, and the output voltage VFP3 of the replica circuit RP3 becomes equal to the reference voltage VRP.

Both of the gate voltages VP1 and VP2 become the lowest voltage, and the gate voltage VP3 becomes the intermediate voltage. As a result, the P-channel MOS transistors P1 and P2 are turned on, the drain current of the P-channel MOS transistor P3 is adjusted to a proper value, and the combined resistance value of the resistance elements RA1 to RA4 and the P-channel MOS transistors P1 to P4 of the output buffer DOB is adjusted to a predetermined value.

Similarly, the operational amplifiers AN1 to AN3 control the gate voltages VN1 to VN3 of the N-channel MOS transistors Q1 to Q3 so that the output voltages VFN1 to VFN3 of the replica circuits RP1 to RP3 become equal to the reference voltage VRN in accordance with the combined resistance value of the resistance elements RB1 to RB3 and the N-channel MOS transistor Q4.

If the output voltage VFN1 of the replica circuit RP1 becomes equal to the reference voltage VRN, the resistance characteristic determined by (VRN−VSS)/ICB is obtained by the gate voltage VN1. ICB denotes the current value of the constant current source CB. Since the output voltages VFN2 and VFN3 of the replica circuits RP2 and RP3 are also controlled to be equal to the reference voltage VRN by the gate voltage VN1, the gate voltages VN2 and VN3 become the lowest voltage and function to turn off the N-channel MOS transistors Q2 and Q3.

On the other hand, when the output voltage VFN1 of the replica circuit RP1 does not become equal to the reference voltage VR, the gate voltage VN1 becomes the highest voltage, and the drain current of the N-channel MOS transistor Q1 is maximized. Further, if the output voltage VFN2 of the replica circuit RP2 does not become equal to the reference voltage VRN, the gate voltage VN2 becomes the highest voltage, and the drain current of the N-channel MOS transistor Q2 becomes also the highest. In this state, for example, if the output voltage VFN3 of the replica circuit RP3 becomes equal to the reference voltage VRN, the resistance characteristic determined by (VRN−VSS)/ICB is obtained by the gate voltage VN3.

Since the gate voltages VN1 to VN3 also control the N-channel MOS transistors Q1 to Q3 of the output buffer DOB, an output impedance Zn at the time when the output buffer DOB outputs the "L" level is adjusted to have the resistance characteristic determined by (VRN−VSS)/ICB.

Concretely, as illustrated in the upper row in FIG. 3, when the combined resistance value of the resistance elements RB1 to RB4 and the N-channel MOS transistor Q4 is higher than a predetermined value and the combined resistance value of the resistance elements RB2 to RB4 and the N-channel MOS transistor Q4 is lower than the predetermined value, all of the output voltages VFN1 to VFN3 of the replica circuits RP1 to RP3 become equal to the reference voltage VRN.

The gate voltage VN1 becomes intermediate voltage, and both of the gate voltages VN2 and VN3 become the lowest voltage. As a result, the drain current of the N-channel MOS transistor Q1 is adjusted to a proper value, the N-channel MOS transistors Q2 and Q3 are turned off, and the combined resistance value of the resistance elements RB1 to RB3 and the N-channel MOS transistors Q1 to Q4 of the output buffer DOB is adjusted to a predetermined value. The resistance value of the resistance element RB4 and that of the resistance element RA4 are equal to each other.

As illustrated in the intermediate row in FIG. 3, when the combined resistance value of the resistance elements RB2 to RB4 and the N-channel MOS transistor Q4 is higher than a predetermined value and the combined resistance value of the resistance elements RB3 and RB4 and the N-channel MOS transistor Q4 is lower than the predetermined value, the output voltage VFN1 of the replica circuit RP1 becomes higher than the reference voltage VRN, and both of the output voltages VFN2 and VFN3 of the replica circuits RP2 and RP3 become equal to the reference voltage VRN.

The gate voltage VN1 becomes the highest voltage, the gate voltage VN2 becomes the intermediate voltage, and the gate voltage VN3 becomes the lowest voltage. As a result, the N-channel MOS transistor Q1 is turned on, the drain current of the N-channel MOS transistor Q2 is adjusted to a proper value, the N-channel MOS transistor Q3 is turned off, and the combined resistance value of the resistance elements RB1 to RB3 and RA4 and the N-channel MOS transistors Q1 to Q4 of the output buffer DOB is adjusted to a predetermined value.

As illustrated in the lower row in FIG. 3, when the combined resistance value of the resistance elements RB3 and RB4 and the N-channel MOS transistor Q4 is higher than a predetermined value and the combined resistance value of the resistance element RB4 and the N-channel MOS transistor Q4 is lower than the predetermined value, both of the output voltages VFN1 and VFN2 of the replica circuits RP1 and RP2 become higher than the reference voltage VRN, and the output voltage VFN3 of the replica circuit RP3 becomes equal to the reference voltage VRN.

Both of the gate voltages VN1 and VN2 become the highest voltage, and the gate voltage VN3 becomes the intermediate voltage. As a result, the N-channel MOS transistors Q1 and Q2 are turned on, the drain current of the N-channel MOS transistor Q3 is adjusted to a proper value, and the combined resistance value of the resistance elements RB1 to RB3 and RB4 and the N-channel MOS transistors Q1 to Q4 of the output buffer DOB is adjusted to a predetermined value.

In the case where an internal data signal φD is at the "H" level, the P-channel MOS transistor P4 is turned off, the N-channel MOS transistor Q4 is turned on, the output terminal TO becomes the "L" level, and the data signal DO becomes the "L" level.

In the case where the internal data signal φD is at the "L" level, the N-channel MOS transistor Q4 is turned off, the P-channel MOS transistor P4 is turned on, the output terminal TO becomes the "H" level, and the data signal DO becomes the "H" level.

Figure 4:
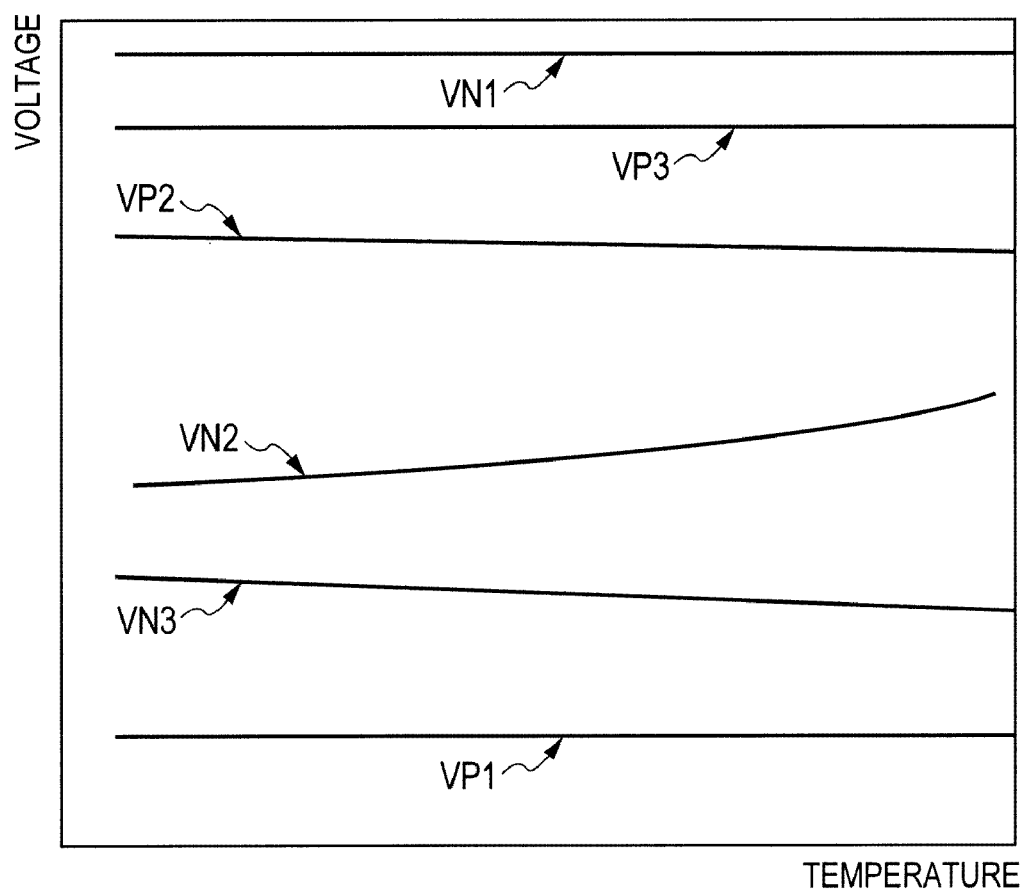
FIG. 4 is a diagram illustrating temperature dependency of gate voltage shown in FIG. 1.

FIG. 4 is a diagram illustrating a result of simulation of changes in the gate voltages VP1 to VP3 and VN1 to VN3 accompanying temperature changes of the semiconductor device. In FIG. 4, the gate voltage VP1 is set to the lowest voltage, the gate voltage VN1 is set to the highest voltage, both of the transistors P1 and Q1 are turned on, the gate voltage VP3 is set to the highest voltage, the gate voltage VN3 is set to the lowest voltage, both of the transistors P3 and Q3 are turned on, each of the gate voltages VP2 and VN2 is set to the intermediate voltage, and the drain current of each of the transistors P2 and Q2 is adjusted. As the temperature rises, the gate voltage VP2 decreases and the gate voltage VN2 increases so that the output impedances Zp and Zn become constant.

Figure 5:
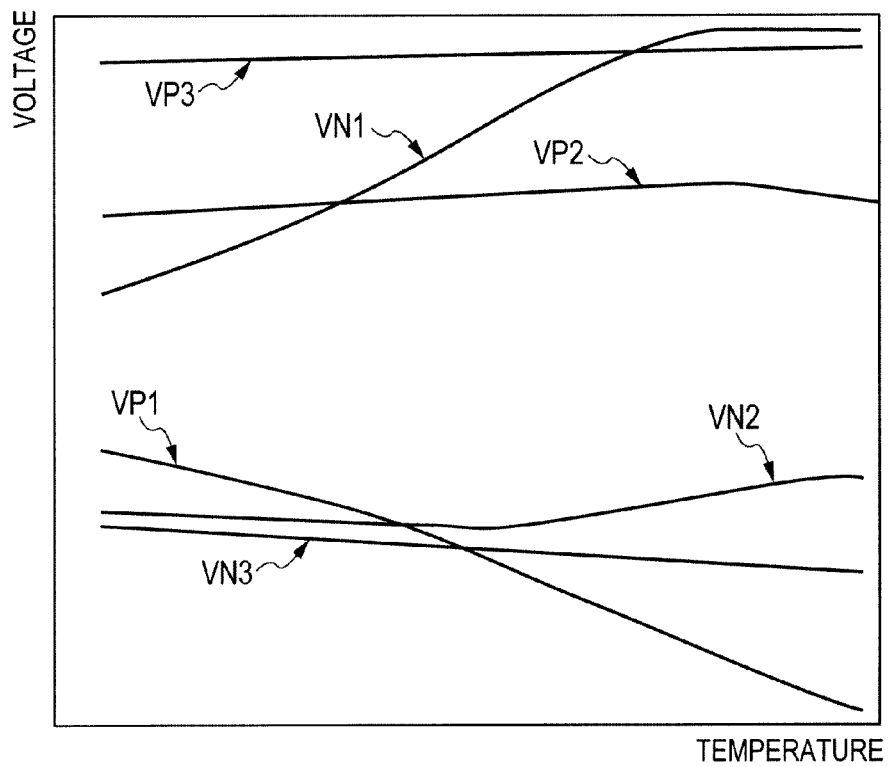
FIG. 5 is another diagram illustrating the temperature dependency of the gate voltage shown in FIG. 1.

FIG. 5 is a diagram illustrating a result of another simulation of changes in the gate voltages VP1 to VP3 and VN1 to VN3 accompanying temperature changes of the semiconductor device. In FIG. 5, in a low-temperature region, the gate voltages VP2 and VP3 are set to the highest voltage, both of the transistors P1 and P3 are turned off, both of the gate voltages VN2 and VN3 are set to the lowest voltage, both of the transistors Q2 and Q3 are turned off, each of the gate voltages VP1 and VN1 is set to the intermediate voltage, and the drain current of each of the transistors P1 and Q1 is adjusted. In the low-temperature region, as the temperature rises, the gate voltage VP1 decreases and the gate voltage VN1 increases so that the output impedances Zp and Zn become constant.

In a high-temperature region, the gate voltage VP1 is set to the lowest voltage, the gate voltage VN1 is set to the highest voltage, both of the transistors P1 and Q1 are turned on, the gate voltage VP3 is set to the highest voltage, the gate voltage VN3 is set to the lowest voltage, both of the transistors P3 and Q3 are turned off, each of the gate voltages VP2 and VN2 is set to the intermediate voltage, and the drain current of each of the transistors P2 and Q2 is adjusted. In the high-temperature region, as the temperature rises, the gate voltage VP2 decreases and the gate voltage VN2 increases so that the output impedances Zp and Zn become constant.

Figure 6:
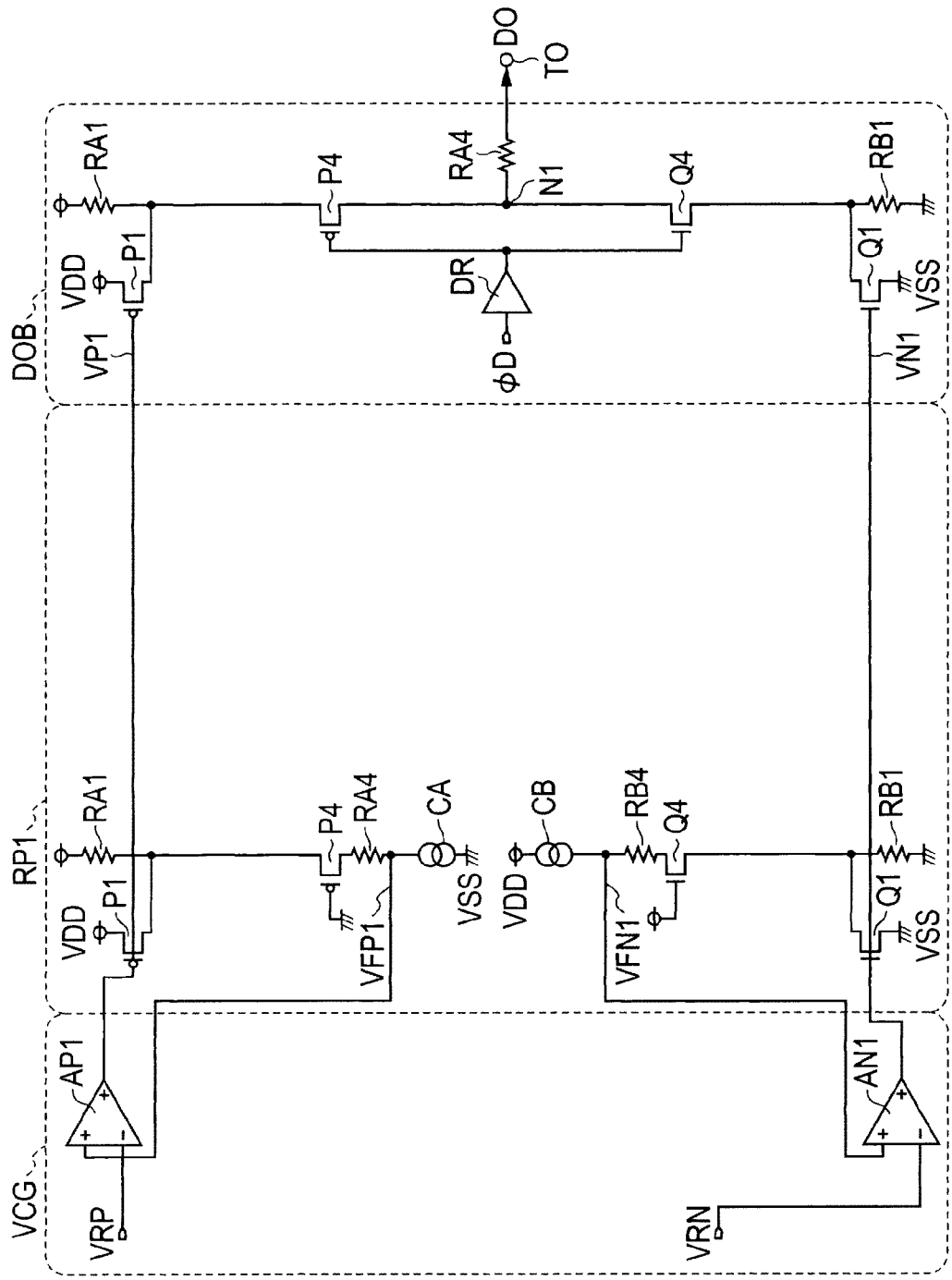
FIG. 6 is a circuit diagram showing a comparative example of the first embodiment.

FIG. 6 is a circuit diagram showing a configuration of a semiconductor device as a comparative example of the first embodiment and is compared to FIG. 1. In FIG. 6, the semiconductor device is different from the semiconductor device of FIG. 1 with respect to the points that the operational amplifiers AP2, AP3, AN2, and AN3 in the control voltage generation circuit VCG are not provided, the transistors P2, P3, Q2, and Q3 and the resistance elements RA2, RA3, RB2, and RB3 in the replica circuit RP1 are not provided, the replica circuits RP2 and RP3 are not provided, and the transistors P2, P3, Q2, and Q3 and the resistance elements RA2, RA3, RB2, and RB3 in the output buffer DOB are not provided.

In the comparative example, in the case where the resistance value of the resistance element RA1 changes beyond a range in which the resistance value can be adjusted by the drain current of the P-channel MOS transistor P1, the output impedance of the output buffer DOB cannot be adjusted to a predetermined value (for example, 40.5 to 49.0Ω). In the case where the resistance value of the resistance element RB1 changes beyond a range in which the resistance value can be adjusted by the drain current of the N-channel MOS transistor Q1, the output impedance Zn of the output buffer DOB cannot be adjusted to a predetermined value.

On the other hand, in the first embodiment, the plurality of P-channel MOS transistors P1 to P3 are provided. Consequently, even in the case where the sum of the resistance values of the resistance elements RA1 to RA4 fluctuates beyond the range in which the resistance value can be adjusted by the drain current of one P-channel MOS transistor P, the output impedance Zp can be adjusted to a predetermined value. Since the plurality of N-channel MOS transistors Q1 to Q3 are provided, even in the case where the sum of the resistance values of the resistance elements RB1 to RB4 (RB1 to RB3 and RA4) fluctuates beyond the range in which the resistance value can be adjusted by the drain current of one N-channel MOS transistor Q, the output impedance Zn can be adjusted to a predetermined value.

In the first embodiment, three sets of transistors P(Q) and the resistance elements RA (RB) are provided and three sets of replica circuits RP and three sets of operational amplifiers AP (AN) are provided. However, the invention is not limited to the embodiment. Obviously, four sets or more (or two sets) of transistors P (Q) and resistance elements RA (RB) may be provided, and four sets or more (or two sets) of replica circuits RP and four sets or more (or two sets) of operational amplifiers AP (AN) may be provided.

Second Embodiment

Figure 7:
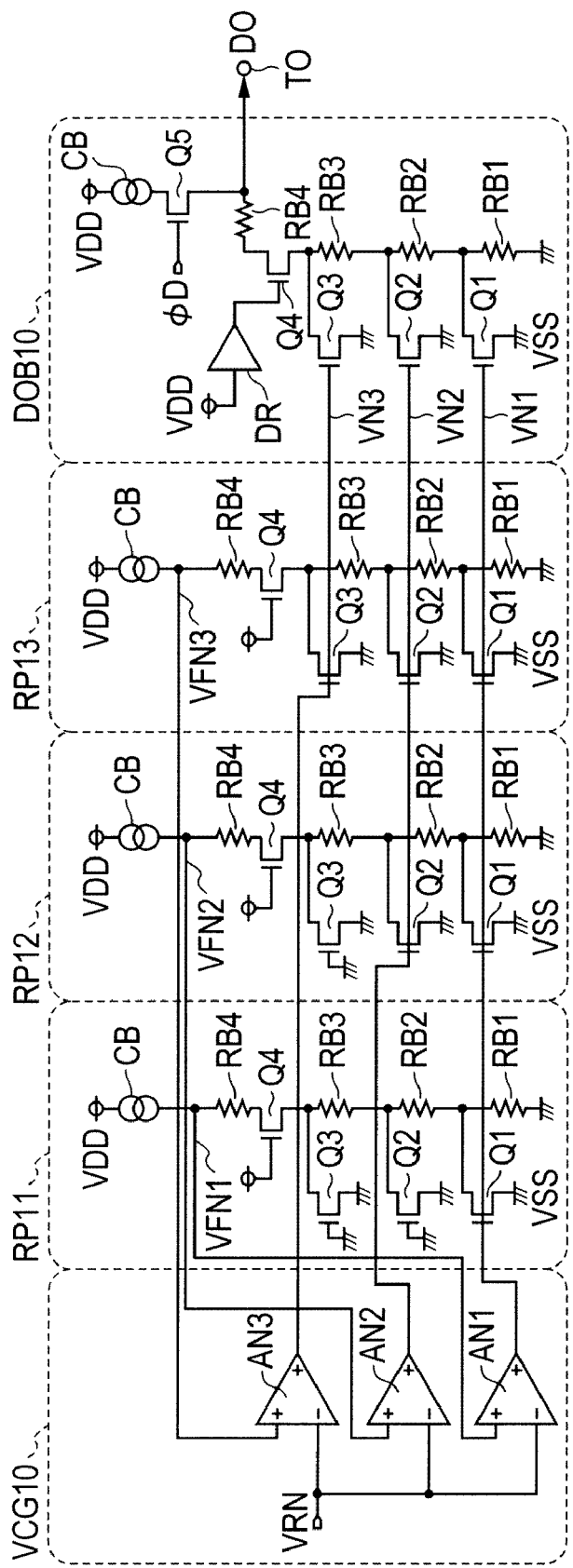
FIG. 7 is a circuit diagram showing a configuration of a semiconductor device according to a second embodiment of the present invention.

A semiconductor device according to a second embodiment of the present invention has, as shown in FIG. 7, a control voltage generation circuit VCG 10, replica circuits RP11 to RP13, an output buffer DOB 10, and an output terminal TO. The output buffer DOB 10 is configured as a high-speed driver circuit of a USB and includes resistance elements RB1 to RB4, N-channel MOS transistors Q1 to Q5, a constant current source CB, and a driver DR.

The constant current source CB and the N-channel MOS transistor Q5 are coupled in series between the line of the power supply voltage VDD and the output terminal TO. The gate of the N-channel MOS transistor Q5 receives the internal data signal φD. The resistance elements RB1 to RB3, the N-channel MOS transistor Q4, and the resistance element RB4 are coupled in series between the line of the ground voltage VSS and the output terminal TO. The sources of the N-channel MOS transistors Q1 to Q3 receive the ground voltage VSS, and the drains are coupled to electrodes on the higher voltage side (the output terminal TO side) of the resistance elements RB1 to RB3. The driver DB supplies a signal of the "H" level to the gate of the transistor Q4 to turn on the transistor Q4.

The control voltage generation circuit VCG10 is obtained by eliminating the operational amplifiers AP1 to AP3 in the control voltage generation circuit VCG in FIG. 1. The replica circuits RP11 to RP13 are obtained by eliminating the resistance elements RA1 to RA4, the P-channel MOS transistors P1 to P4, and the constant current source CA in the replica circuits RP1 to RP3 in FIG. 1.

Next, the operation of the semiconductor device will be described. The operational amplifiers AN1 to AN3 control the gate voltages VN1 to VN3 of the N-channel MOS transistors Q1 to Q3 so that the output voltages VFN1 to VFN3 of the replica circuits RP11 to RP13 become equal to the reference voltage VRN in accordance with the value of combined resistance of the resistance elements RB1 to RB3 and the N-channel MOS transistor Q4.

If the output voltage VFN1 of the replica circuit RP11 becomes equal to the reference voltage VRP, the resistance characteristic determined by (VRN−VSS)/ICB is obtained by the gate voltage VN1. ICB denotes the current value of the constant current source CB. Since the output voltages VFN2 and VFN3 of the replica circuits RP12 and RP13 are also controlled to be equal to the reference voltage VRN by the gate voltage VN1, the gate voltages VN2 and VN3 become the lowest voltage and function to turn off the N-channel MOS transistors Q2 and Q3.

On the other hand, if the output voltage VFN1 of the replica circuit RP11 does not become equal to the reference voltage VRN, the gate voltage VN1 becomes the highest voltage, and the drain current of the N-channel MOS transistor Q1 is set to the highest voltage. Further, if the output voltage VFN2 of the replica circuit RP12 does not become equal to the reference voltage VRN, the gate voltage VN2 becomes the highest voltage, and the drain current of the N-channel MOS transistor Q2 also becomes the largest. In this state, for example, if the output voltage VFN3 of the replica circuit RP13 does not become equal to the reference voltage VRN, the resistance characteristic determined by (VRN−VSS)/ICB is obtained by the gate voltage VN3.

Since the gate voltages VN1 to VN3 also control the N-channel MOS transistors Q1 to Q3 of the output buffer DOB 10, the output impedance Zn at the time when the output buffer DOB outputs the "L" level is adjusted to have the resistance characteristic determined by (VRN−VSS)/ICB.

In the case where the internal data signal φD is at the "H" level, the N-channel MOS transistor P5 is turned on, the output terminal TO becomes the "H" level, and the data signal DO becomes the "H" level. In the case where the internal data signal φD is at the "L" level, the N-channel MOS transistor Q5 is turned off, the output terminal TO becomes the "L" level, and the data signal DO becomes the "L" level.

Concretely, as illustrated in the upper row in FIG. 8, when the combined resistance value of the resistance elements RB1 to RB4 and the N-channel MOS transistor Q4 is higher than a predetermined value and the combined resistance value of the resistance elements RB2 to RB4 and the N-channel MOS transistor Q4 is lower than the predetermined value, all of the output voltages VFN1 to VFN3 of the replica circuits RP11 to RP13 become equal to the reference voltage VRN.

The gate voltage VN1 becomes intermediate voltage, and both of the gate voltages VN2 and VN3 become the lowest voltage. As a result, the drain current of the N-channel MOS transistor Q1 is adjusted to a proper value, the N-channel MOS transistors Q2 and Q3 are turned off, and the combined resistance value of the resistance elements RB1 to RB4 and the N-channel MOS transistors Q1 to Q4 of the output buffer DOB10 is adjusted to a predetermined value.

As illustrated in the intermediate row in FIG. 8, when the combined resistance value of the resistance elements RB2 to RB4 and the N-channel MOS transistor Q4 is higher than a predetermined value and the combined resistance value of the resistance elements RB3 and RB4 and the N-channel MOS transistor Q4 is lower than the predetermined value, the output voltage VFN1 of the replica circuit RP11 becomes higher than the reference voltage VRN, and both of the output voltages VFN2 and VFN3 of the replica circuits RP12 and RP13 become equal to the reference voltage VRN.

The gate voltage VN1 becomes the highest voltage, the gate voltage VN2 becomes the intermediate voltage, and the gate voltage VN3 becomes the lowest voltage. As a result, the N-channel MOS transistor Q1 is turned on, the drain current of the N-channel MOS transistor Q2 is adjusted to a proper value, the N-channel MOS transistor Q3 is turned off, and the combined resistance value of the resistance elements RB1 to RB4 and the N-channel MOS transistors Q1 to Q4 of the output buffer DOB10 is adjusted to a predetermined value.

As illustrated in the lower row in FIG. 8, when the combined resistance value of the resistance elements RB2 and RB4 and the N-channel MOS transistor Q4 is higher than a predetermined value and the combined resistance value of the resistance element RB4 and the N-channel MOS transistor Q4 is lower than the predetermined value, both of the output voltages VFN1 and VFN2 of the replica circuits RP11 and RP12 become higher than the reference voltage VRN, and the output voltage VFN3 of the replica circuit RP13 becomes equal to the reference voltage VRN.

Both of the gate voltages VN1 and VN2 become the highest voltage, and the gate voltage VN3 becomes the intermediate voltage. As a result, the N-channel MOS transistors Q1 and Q2 are turned on, the drain current of the N-channel MOS transistor Q3 is adjusted to a proper value, and the combined resistance value of the resistance elements RB1 to RB4 and the N-channel MOS transistors Q1 to Q4 of the output buffer DOB10 is adjusted to a predetermined value.

Figure 9:
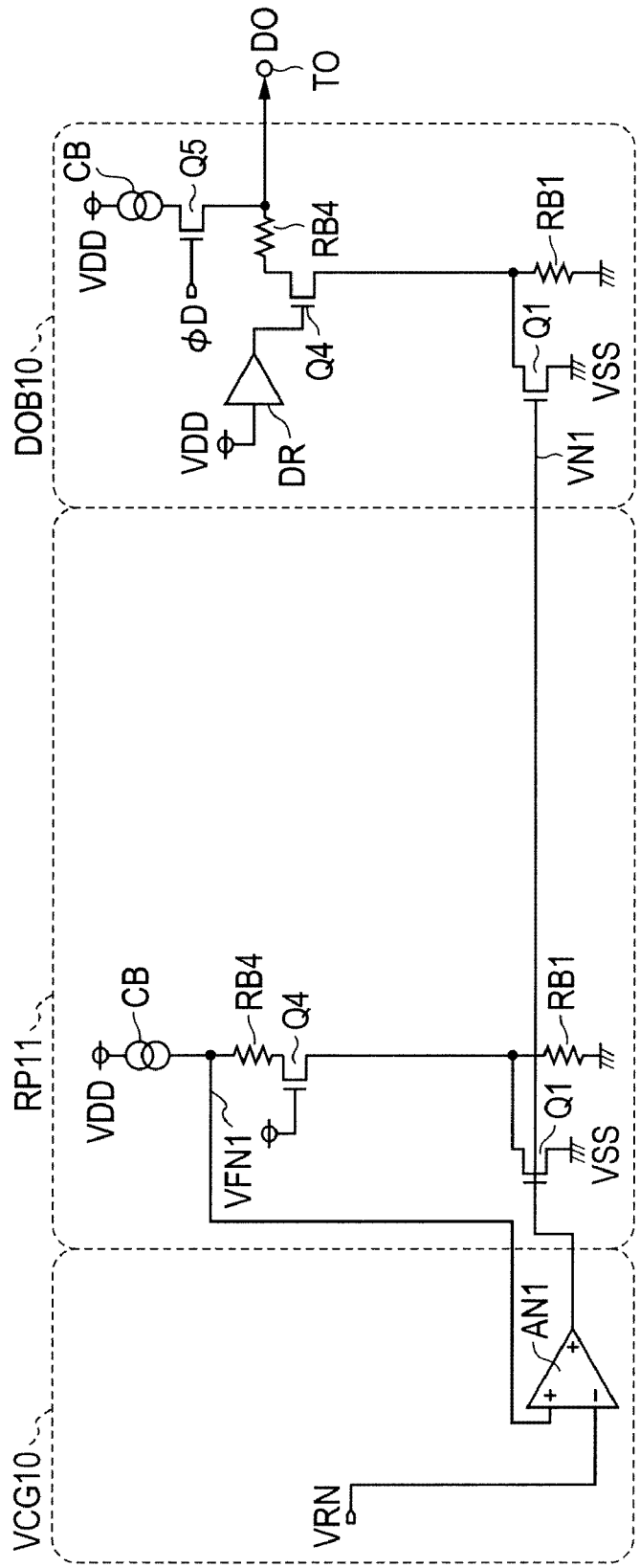
FIG. 9 is a circuit diagram illustrating a comparative example of the second embodiment.

FIG. 9 is a circuit diagram illustrating a configuration of a semiconductor device as a comparative example of the second embodiment and is a diagram which is compared to FIG. 7. The semiconductor device of FIG. 9 is different from that of FIG. 7 with respect to the points that the operational amplifiers AN2 and AN3 in the control voltage generation circuit VCG10 are not provided, the transistors Q2 and Q3 and the resistance elements RB2 and RB3 in the replica circuit RP11 are not provided, the replica circuits RP12 and RP13 are not provided, and the transistors Q2 and Q3 and the resistive elements RB2 and RB3 in the output buffer DOB10 are not provided.

In the comparative example, in the case where the resistance value of the resistance element RB1 changes beyond a range in which the resistance value can be adjusted by the drain current of the N-channel MOS transistor Q1, the output impedance Zn of the output buffer DOB cannot be adjusted to a predetermined value.

On the other hand, in the second embodiment, the plurality of N-channel MOS transistors Q1 to Q3 are provided. Consequently, even in the case where the sum of the resistance values of the resistance elements RB1 to RB4 (RB1 to RB3, RA4) fluctuates beyond the range in which the resistance value can be adjusted by the drain current of one N-channel MOS transistor Q, the output impedance Zn can be adjusted to a predetermined value.

In the second embodiment, three sets of transistors Q and the resistance elements RB are provided and three sets of replica circuits RP and three sets of operational amplifiers AN are provided. However, the invention is not limited to the embodiment. Obviously, four sets or more (or two sets) of transistors Q and resistance elements RB may be provided, and four sets or more (or two sets) of replica circuits RP and four sets or more (or two sets) of operational amplifiers AN may be provided.

Third Embodiment

Figure 10:
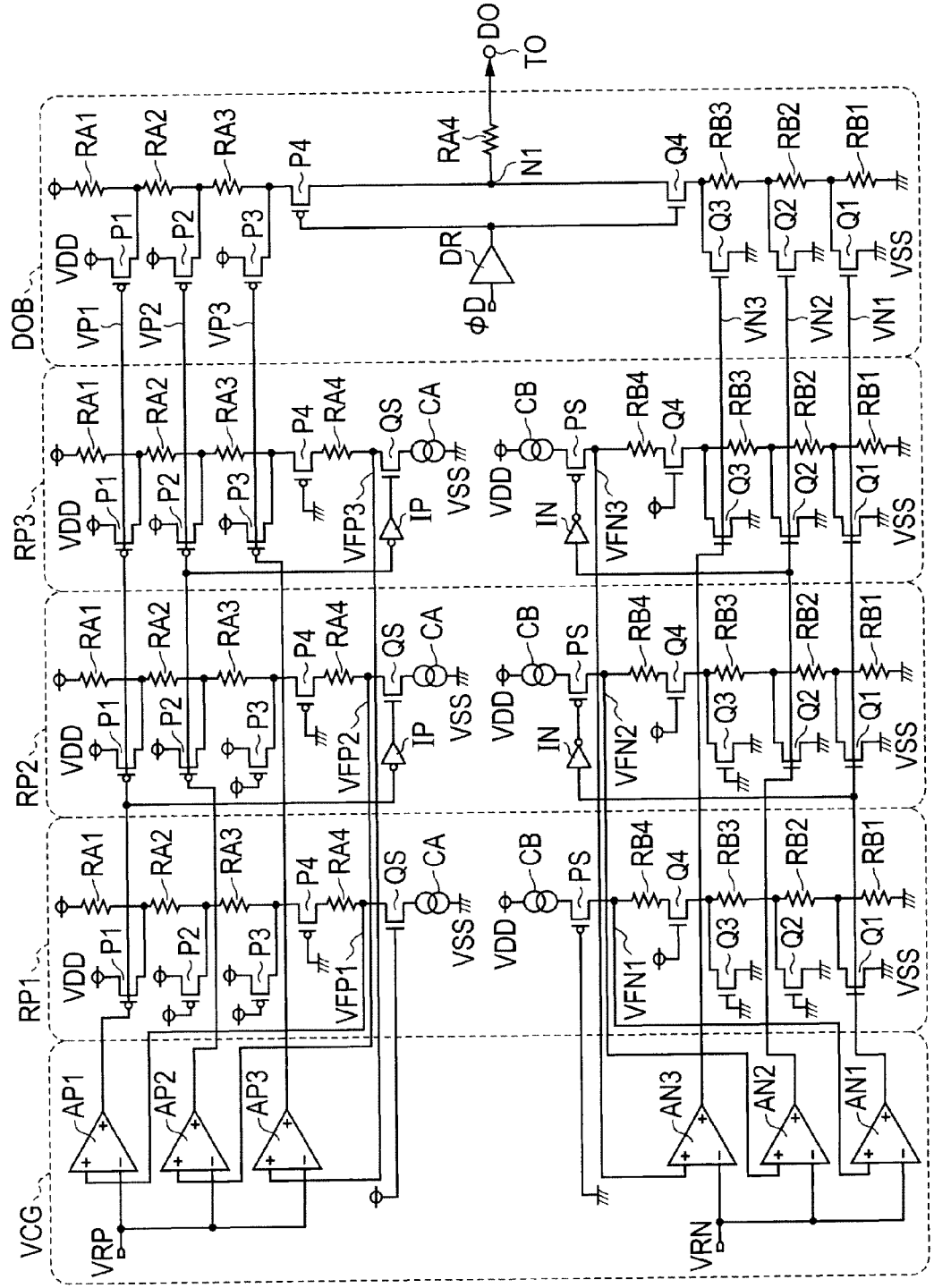
FIG. 10 is a circuit diagram showing a configuration of a semiconductor device according to a third embodiment of the invention.

FIG. 10 is a circuit diagram showing a main part of a semiconductor device according to a third embodiment of the invention and is compared to FIG. 1. The semiconductor device of FIG. 10 is different from the semiconductor device of FIG. 1 with respect to the points that an N-channel MOS transistor QS and a P-channel MOS transistor PS are added to the replica circuit RP1, and inverters IP and IN, an N-channel MOS transistor QS, and a P-channel MOS transistor PS are added to each of the replica circuits RP2 and RP3.

The drain of the N-channel MOS transistor QS is coupled to an electrode on the low voltage side (the ground voltage VSS side) of the resistance element RA4, and the source is coupled to the line of the ground voltage VSS via the constant current source CA. The source of the P-channel MOS transistor PS is coupled to the line of the power supply voltage VDD via the constant current source CB, and the drain is coupled to the electrode on the high voltage side (the power supply voltage VDD side) of the resistance element RB4.

In the replica circuit RP1, the power supply voltage VSS is applied to the gate of the transistor QS, the ground voltage VSS is applied to the gate of the transistor PS, and both of the transistors QS and PS are fixed in the on state.

In the replica circuit RP2, the input node of the inverter IP receives the gate voltage VP1, and an output signal of the inverter IP is supplied to the gate of the N-channel MOS transistor QS. In the case where the gate voltage VP1 is lower than a threshold voltage VTHP of the inverter IP, an output signal of the inverter IP becomes the "H" level, and the N-channel MOS transistor QS is turned on. In the case where the gate voltage VP1 is higher than the threshold voltage VTHP of the inverter IP, an output signal of the inverter IP becomes the "L" level, and the N-channel MOS transistor QS is turned off.

The input node of the inverter IN receives the gate voltage VN1, and an output signal of the inverter IN is supplied to the gate of the P-channel MOS transistor PS. In the case where the gate voltage VN1 is lower than a threshold voltage VTHN of the inverter IN, an output signal of the inverter IN becomes the "H" level, and the P-channel MOS transistor PS is turned off. In the case where the gate voltage VN1 is higher than the threshold voltage VTHN of the inverter IN, an output signal of the inverter IN becomes the "L" level, and the P-channel MOS transistor PS is turned on.

In the replica circuit RP3, the input node of the inverter IP receives the gate voltage VP2, and an output signal of the inverter IP is supplied to the gate of the N-channel MOS transistor QS. In the case where the gate voltage VP2 is lower than the threshold voltage VTHP of the inverter IP, an output signal of the inverter IP becomes the "H" level, and the N-channel MOS transistor QS is turned on. In the case where the gate voltage VP2 is higher than the threshold voltage VTHP of the inverter IP, an output signal of the inverter IP becomes the "L" level, and the N-channel MOS transistor QS is turned off.

The input node of the inverter IN receives the gate voltage VN2, and an output signal of the inverter IN is supplied to the gate of the P-channel MOS transistor PS. In the case where the gate voltage VN2 is lower than the threshold voltage VTHN of the inverter IN, an output signal of the inverter IN becomes the "H" level, and the P-channel MOS transistor PS is turned off. In the case where the gate voltage VN2 is higher than the threshold voltage VTHN of the inverter IN, an output signal of the inverter IN becomes the "L" level, and the P-channel MOS transistor PS is turned on.

Next, the operation of the semiconductor device will be described. In the case where the output voltage VFP1 of the replica circuit RP1 becomes equal to the reference voltage VRP, the inverter IP of the replica circuit RP2 detects that the gate voltage VP1 is not the lowest voltage, and the N-channel MOS transistor QS of the replica circuit RP2 is turned off to interrupt the current of the constant current source CA.

When the current of the constant current source CA is interrupted, the output voltage VFP2 of the replica circuit RP2 becomes the power supply voltage VDD, and the gate voltage VP2 becomes the highest voltage. As a result, the inverter IP of the replica circuit RP3 turns off the N-channel MOS transistor QS to interrupt the current of the constant current source CA. When the current of the constant current source CA is interrupted, the output voltage VFP3 of the replica circuit RP3 becomes the power supply voltage VDD, and the gate voltage VP3 becomes the highest voltage.

Concretely, as illustrated in the upper row in FIG. 11, when the combined resistance value of the resistance elements RA1 to RA4 and the P-channel MOS transistor P4 is higher than a predetermined value and the combined resistance value of the resistance elements RA2 to RA4 and the P-channel MOS transistor P4 is lower than the predetermined value, the output voltage VFP1 of the replica circuit RP1 becomes equal to the reference voltage VRP. The gate voltage VP1 becomes the intermediate voltage, and both of the gate voltages VP2 and VP3 become the highest voltage.

As a result, in each of the replica circuits RP2 and RP3, the output signal of the inverter IP becomes the "L" level, the N-channel MOS transistor QS is turned off, and the output voltages VFP2 and VFP3 of the replica circuits RP2 and RP3 become the power supply voltage VDD.

The drain current of the P-channel MOS transistor P1 is adjusted to a proper value, the P-channel MOS transistors P2 and P3 are turned off, and the combined resistance value of the resistance elements RA1 to RA4 and the P-channel MOS transistors P1 to P4 of the output buffer DOB is adjusted to a predetermined value.

As illustrated in the intermediate row in FIG. 11, when the combined resistance value of the resistance elements RA2 to RA4 and the P-channel MOS transistor P4 is higher than a predetermined value and the combined resistance value of the resistance elements RA3 and RA4 and the P-channel MOS transistor P4 is lower than the predetermined value, the output voltage VFP1 of the replica circuit RP1 becomes lower than the reference voltage VRP, and the output voltage VFP2 of the replica circuit RP2 becomes equal to the reference voltage VRP. The gate voltage VP1 becomes the lowest voltage, the gate voltage VP2 becomes the intermediate voltage, and the gate voltage VP3 becomes the highest voltage.

As a result, in the replica circuit RP2, an output signal of the inverter IP becomes the "H" level, and the N-channel MOS transistor QS is turned on. In the replica circuit RP3, an output signal of the inverter IP becomes the "L" level, the N-channel MOS transistor QS is turned off, and the output voltage VFP3 of the replica circuit RP3 becomes the power supply voltage VDD.

The P-channel MOS transistor P1 is turned on, the drain current of the P-channel MOS transistor P2 is adjusted to a proper value, the P-channel MOS transistor P3 is turned off, and the combined resistance value of the resistance elements RA1 to RA4 and the P-channel MOS transistors P1 to P4 of the output buffer DOB is adjusted to a predetermined value.

As illustrated in the lower row in FIG. 11, when the combined resistance value of the resistance elements RA3 and RA4 and the P-channel MOS transistor P4 is lower than a predetermined value and the combined resistance value of the resistance element RA4 and the P-channel MOS transistor P4 is lower than the predetermined value, both of the output voltages VFP1 and VFP2 of the replica circuits RP1 and RP2 become lower than the reference voltage VRP, and the output voltage VFP3 of the replica circuit RP3 becomes equal to the reference voltage VRP.

Both of the gate voltages VP1 and VP2 become the lowest voltage, and the gate voltage VP3 becomes the intermediate voltage. As a result, in each of the replica circuits RP2 and RP3, an output signal of the inverter IP becomes the "H" level, and the N-channel MOS transistor QS is turned on.

The P-channel MOS transistors P1 and P2 are turned on, the drain current of the P-channel MOS transistor P3 is adjusted to a proper value, and the combined resistance value of the resistance elements RA1 to RA4 and the P-channel MOS transistors P1 to P4 in the output buffer DOB is adjusted to a predetermined value.

Similarly, in the case where the output voltage VFN1 of the replica circuit RP1 becomes equal to the reference voltage VRN, the inverter IN of the replica circuit RP2 detects that the gate voltage VN1 is not the highest voltage, and the P-channel MOS transistor PS of the replica circuit RP2 is turned off to interrupt the current of the constant current source CB.

When the current of the constant current source CB is interrupted, the output voltage VFN2 of the replica circuit RP2 becomes the ground voltage VSS, and the gate voltage VN2 becomes the lowest voltage. As a result, the inverter IN of the replica circuit RP3 turns off the P-channel MOS transistor PS to interrupt the current of the constant current source CB. When the current of the constant current source CB is interrupted, the output voltage VFN3 of the replica circuit RP3 becomes the ground voltage VSS, and the gate voltage VN3 becomes the lowest voltage.

Concretely, as illustrated in the upper row in FIG. 12, when the combined resistance value of the resistance elements RB1 to RB4 and the N-channel MOS transistor Q4 is higher than a predetermined value and the combined resistance value of the resistance elements RB2 to RB4 and the N-channel MOS transistor Q4 is lower than the predetermined value, the output voltage VFN1 of the replica circuit RP1 becomes equal to the reference voltage VRN. The gate voltage VN1 becomes the intermediate voltage, and both of the gate voltages VN2 and VN3 become the lowest voltage.

As a result, in each of the replica circuits RP2 and RP3, the output signal of the inverter IN becomes the "H" level, the P-channel MOS transistor PS is turned off, and the output voltages VFN2 and VFN3 of the replica circuits RP2 and RP3 become the ground voltage VSS.

The drain current of the N-channel MOS transistor Q1 is adjusted to a proper value, the N-channel MOS transistors Q2 and Q3 are turned off, and the combined resistance value of the resistance elements RB1 to RB4 and the N-channel MOS transistors Q1 to Q4 of the output buffer DOB is adjusted to a predetermined value.

As illustrated in the intermediate row in FIG. 12, when the combined resistance value of the resistance elements RB2 to RB4 and the N-channel MOS transistor Q4 is higher than a predetermined value and the combined resistance value of the resistance elements RB3 and RB4 and the N-channel MOS transistor Q4 is lower than the predetermined value, the output voltage VFN1 of the replica circuit RP1 becomes higher than the reference voltage VRN, and the output voltage VFN2 of the replica circuit RP2 becomes equal to the reference voltage VRN. The gate voltage VN1 becomes the highest voltage, the gate voltage VN2 becomes the intermediate voltage, and the gate voltage VN3 becomes the lowest voltage.

In the replica circuit RP2, an output signal of the inverter IN becomes the "L" level, and the P-channel MOS transistor PS is turned on. In the replica circuit RP3, an output signal of the inverter IN becomes the "H" level, the P-channel MOS transistor PS is turned off, and the output voltage VFN3 of the replica circuit RP3 becomes the ground voltage VSS.

The N-channel MOS transistor Q1 is turned on, the drain current of the N-channel MOS transistor Q2 is adjusted to a proper value, the N-channel MOS transistor Q3 is turned off, and the combined resistance value of the resistance elements RB1 to RB4 and the N-channel MOS transistors Q1 to Q4 of the output buffer DOB is adjusted to a predetermined value.

As illustrated in the lower row in FIG. 12, when the combined resistance value of the resistance elements RB3 and RB4 and the N-channel MOS transistor Q4 is higher than a predetermined value and the combined resistance value of the resistance element RB4 and the N-channel MOS transistor Q4 is lower than the predetermined value, both of the output voltages VFN1 and VFN2 of the replica circuits RP1 and RP2 become higher than the reference voltage VRP, and the output voltage VFN3 of the replica circuit RP3 becomes equal to the reference voltage VRP.

Both of the gate voltages VN1 and VN2 become the highest voltage, and the gate voltage VN3 becomes the intermediate voltage. As a result, in each of the replica circuits RP2 and RP3, an output signal of the inverter IN becomes the "L" level, and the P-channel MOS transistor PS is turned on. The N-channel MOS transistors Q1 and Q2 are turned on, the drain current of the N-channel MOS transistor Q3 is adjusted to a proper value, and the combined resistance value of the resistance elements RB1 to RB4 and the N-channel MOS transistors Q1 to Q4 of the output buffer DOB is adjusted to a predetermined value.

Figure 13:
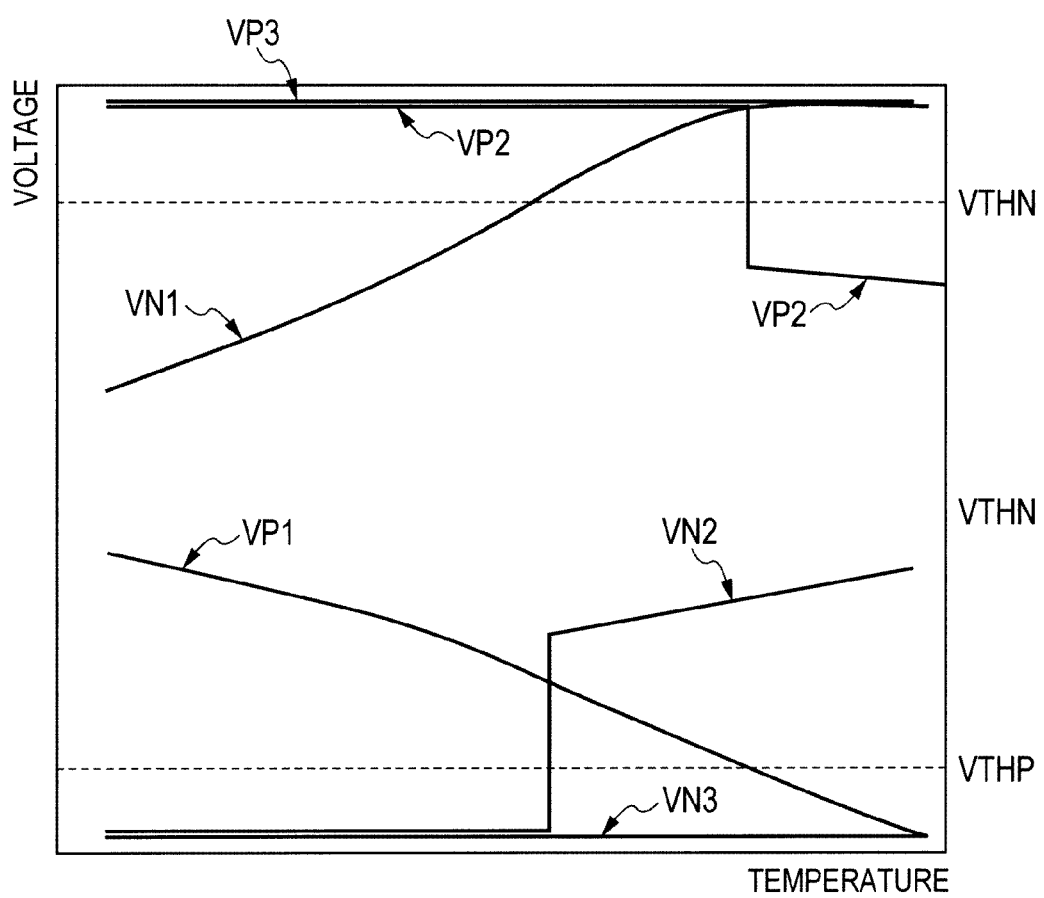
FIG. 13 is a diagram illustrating the temperature dependency of the gate voltage shown in FIG. 10.

FIG. 13 is a diagram illustrating a result of simulation of changes in the gate voltages VP1 to VP3 and VN1 to VN3 accompanying temperature changes of the semiconductor device. In FIG. 13, in a low-temperature region, both of the gate voltages VP2 and VP3 are set to the power supply voltage VDD, both of the transistors P2 and P3 are turned off, both of the gate voltages VN2 and VN3 are set to the ground voltage VSS, both of the transistors Q2 and Q3 are turned off, each of the gate voltages VP1 and VN1 is set to the intermediate voltage, and the drain current of each of the transistors P1 and Q1 is adjusted. In the low-temperature region, as the temperature rises, the gate voltage VP1 decreases and the gate voltage VN1 increases so that the output impedances Zp and Zn become constant.

When the temperature further rises and the gate voltage VN1 becomes higher than the threshold voltage VTHN of the inverter IN, the P-channel MOS transistor PS of the replica circuit RP2 is turned on, and the gate voltage VN2 is increased from the ground voltage VSS to the intermediate voltage.

When the temperature further rises and the gate voltage VP1 becomes lower than the threshold voltage VTHP of the inverter IP, the N-channel MOS transistor QS of the replica circuit RP2 is turned on, and the gate voltage VP2 is decreased from the power supply voltage VDD to the intermediate voltage.

In a high-temperature region, the gate voltage VP1 is set to the lowest voltage, the gate voltage VN1 is set to the highest voltage, both of the transistors P1 and Q1 are turned on, the gate voltage VP3 is set to the power supply voltage VDD, the gate voltage VN3 is set to the ground voltage VSS, both of the transistors P3 and Q3 are turned off, each of the gate voltages VP2 and VN2 is set to the intermediate voltage, and the drain current of each of the transistors P2 and Q2 is adjusted. In the high-temperature region, as the temperature rises, the gate voltage VP2 decreases and the gate voltage VN2 increases so that the output impedances Zp and Zn become constant.

In the third embodiment, the effect similar to that of the first embodiment is obtained. In addition, since through current of the replica circuit RP which does not exert an influence on the adjustment of the output impedances Zp and Zn can be interrupted, power consumption is smaller than that of the first embodiment.

Fourth Embodiment

Figure 14:
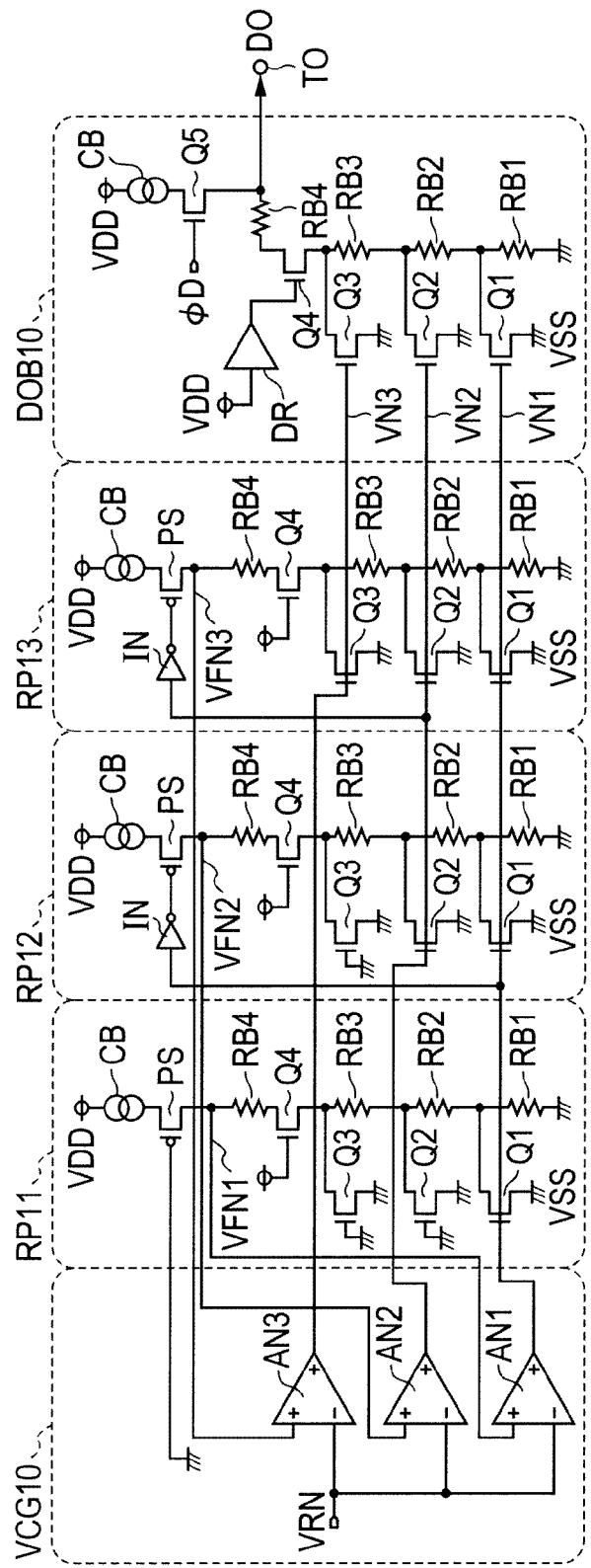
FIG. 14 is a circuit diagram illustrating a configuration of a semiconductor device according to a fourth embodiment of the invention.

FIG. 14 is a circuit diagram showing a main part of a semiconductor device according to a fourth embodiment of the invention and is compared to FIG. 7. The semiconductor device of FIG. 14 is different from the semiconductor device of FIG. 7 with respect to the points that a P-channel MOS transistor PS is added to the replica circuit RP11, and the inverter IN and the P-channel MOS transistor PS are added to each of the replica circuits RP12 and RP13.

The source of the P-channel MOS transistor PS is coupled to the line of the power supply voltage VDD via the constant current source CB. The drain of the P-channel MOS transistor PS is coupled to the electrode on the high voltage side (the power supply voltage VDD side) of the resistance element RB4. In the replica circuit RP11, the power supply voltage VSS is applied to the gate of the transistor PS, and the transistor PS is fixed in the on state.

In the replica circuit RP12, the input node of the inverter IN receives the gate voltage VN1, and an output signal of the inverter IN is supplied to the gate of the P-channel MOS transistor PS. In the case where the gate voltage VN1 is lower than a threshold voltage VTHN of the inverter IN, an output signal of the inverter IN becomes the "H" level, and the P-channel MOS transistor PS is turned off. In the case where the gate voltage VN1 is higher than the threshold voltage VTHN of the inverter IN, an output signal of the inverter IN becomes the "L" level, and the P-channel MOS transistor PS is turned on.

In the replica circuit RP13, the input node of the inverter IN receives the gate voltage VN2, and an output signal of the inverter IN is supplied to the gate of the P-channel MOS transistor PS. In the case where the gate voltage VN2 is lower than a threshold voltage VTHN of the inverter IN, an output signal of the inverter IN becomes the "H" level, and the P-channel MOS transistor PS is turned off. In the case where the gate voltage VN2 is higher than the threshold voltage VTHN of the inverter IN, an output signal of the inverter IN becomes the "L" level, and the P-channel MOS transistor PS is turned on.

Next, the operation of the semiconductor device will be described. In the case where the output voltage VFN1 of the replica circuit RP11 becomes equal to the reference voltage VRN, the inverter IN of the replica circuit RP12 detects that the gate voltage VN1 is not the highest voltage, and the P-channel MOS transistor PS of the replica circuit RP12 is turned off to interrupt the current of the constant current source CB.

When the current of the constant current source CB is interrupted, the output voltage VFN2 of the replica circuit RP12 becomes the ground voltage VSS, and the gate voltage VN2 becomes the lowest voltage. As a result, the inverter IN of the replica circuit RP13 turns off the P-channel MOS transistor PS to interrupt the current of the constant current source CB. When the current of the constant current source CB is interrupted, the output voltage VFN3 of the replica circuit RP13 becomes the ground voltage VSS, and the gate voltage VN3 becomes the lowest voltage.

Concretely, as illustrated in the upper row in FIG. 15, when the combined resistance value of the resistance elements RB1 to RB4 and the N-channel MOS transistor Q4 is higher than a predetermined value and the combined resistance value of the resistance elements RB2 to RB4 and the N-channel MOS transistor Q4 is lower than the predetermined value, the output voltage VFN1 of the replica circuit RP11 becomes equal to the reference voltage VRN. The gate voltage VN1 becomes the intermediate voltage, and both of the gate voltages VN2 and VN3 become the lowest voltage.

As a result, in each of the replica circuits RP12 and RP13, the output signal of the inverter IN becomes the "H" level, the P-channel MOS transistor PS is turned off, and the output voltages VFN2 and VFN3 of the replica circuits RP2 and RP3 become the ground voltage VSS.

The drain current of the N-channel MOS transistor Q1 is adjusted to a proper value, the N-channel MOS transistors Q2 and Q3 are turned off, and the combined resistance value of the resistance elements RB1 to RB4 and the N-channel MOS transistors Q1 to Q4 of the output buffer DOB is adjusted to a predetermined value.

As illustrated in the intermediate row in FIG. 15, when the combined resistance value of the resistance elements RB2 to RB4 and the N-channel MOS transistor Q4 is higher than a predetermined value and the combined resistance value of the resistance elements RB3 and RB4 and the N-channel MOS transistor Q4 is lower than the predetermined value, the output voltage VFN1 of the replica circuit RP11 becomes higher than the reference voltage VRN, and the output voltage VFN2 of the replica circuit RP12 becomes equal to the reference voltage VRN. The gate voltage VN1 becomes the highest voltage, the gate voltage VN2 becomes the intermediate voltage, and the gate voltage VN3 becomes the lowest voltage.

As a result, in the replica circuit RP12, an output signal of the inverter IN becomes the "L" level, and the P-channel MOS transistor PS is turned on. In the replica circuit RP13, an output signal of the inverter IN becomes the "H" level, the P-channel MOS transistor PS is turned off, and the output voltage VFN3 of the replica circuit RP13 becomes the ground voltage VSS.

The N-channel MOS transistor Q1 is turned on, the drain current of the N-channel MOS transistor Q2 is adjusted to a proper value, the N-channel MOS transistor Q3 is turned off, and the combined resistance value of the resistance elements RB1 to RB4 and the N-channel MOS transistors Q1 to Q4 of the output buffer DOB is adjusted to a predetermined value.

As illustrated in the lower row in FIG. 15, when the combined resistance value of the resistance elements RB3 and RB4 and the N-channel MOS transistor Q4 is higher than a predetermined value and the combined resistance value of the resistance element RB4 and the N-channel MOS transistor Q4 is lower than the predetermined value, both of the output voltages VFN1 and VFN2 of the replica circuits RP11 and RP12 become higher than the reference voltage VRN, and the output voltage VFN3 of the replica circuit RP13 becomes equal to the reference voltage VRN.

Both of the gate voltages VN1 and VN2 become the highest voltage, and the gate voltage VN3 becomes the intermediate voltage. As a result, in each of the replica circuits RP12 and RP13, an output signal of the inverter IN becomes the "L" level, and the P-channel MOS transistor PS is turned on.

The N-channel MOS transistors Q1 and Q2 are turned on, the drain current of the N-channel MOS transistor Q3 is adjusted to a proper value, and the combined resistance value of the resistance elements RB1 to RB4 and the P-channel MOS transistors Q1 to Q4 in the output buffer DOB is adjusted to a predetermined value.

In the fourth embodiment, the effect similar to that of the second embodiment is obtained. In addition, since through current of the replica circuit RP which does not exert an influence on the adjustment of the output impedances Zp and Zn can be interrupted, power consumption is smaller than that of the second embodiment.

Fifth Embodiment

Figure 16:
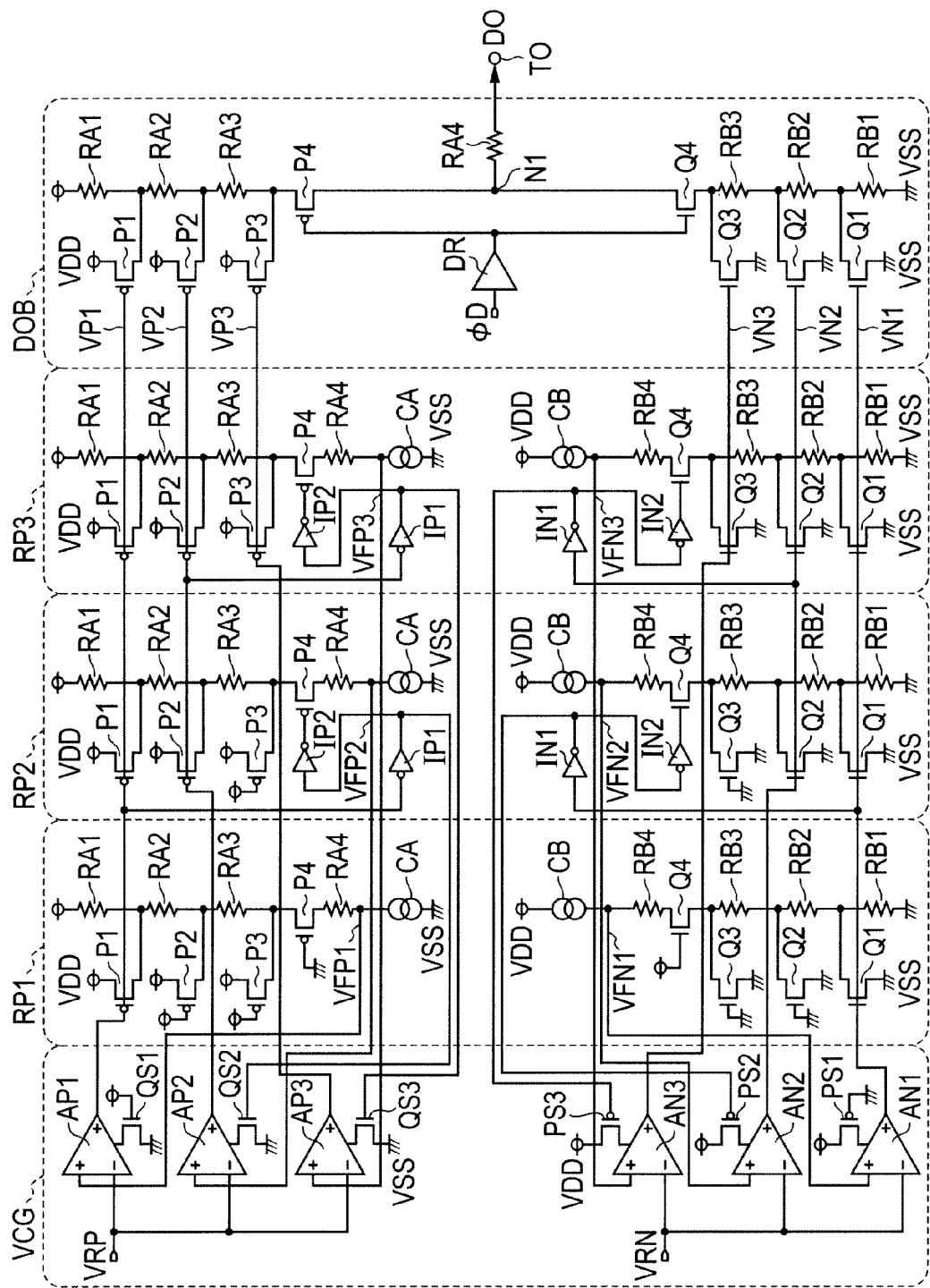
FIG. 16 is a circuit diagram illustrating a configuration of a semiconductor device according to a fifth embodiment of the invention.

FIG. 16 is a circuit diagram showing a main part of a semiconductor device according to a fifth embodiment of the invention and is compared to FIG. 1. The semiconductor device of FIG. 16 is different from the semiconductor device of FIG. 1 with respect to the points that the N-channel MOS transistors QS1 to QS3 and the P-channel MOS transistors PS1 to PS3 are added to the control voltage generation circuit VCG, and the inverters IP1, IP2, IN1, and IN2 are added to each of the replica circuits RP2 and RP3.

The drains of the N-channel MOS transistors QS1 to QS3 are coupled to the negative-side power supply nodes of the operational amplifiers AP1 to AP3, and the sources receive the ground voltage VSS. The gate of the N-channel MOS transistor QS1 receives the power supply voltage VDD and is fixed in the on state. The sources of the P-channel MOS transistors PS1 to PS3 receive the power supply voltage VDD, and the drains are coupled to the power supply nodes on the positive side of the operational amplifiers AN1 to AN3. The P-channel MOS transistor PS1 receives the ground voltage VSS by its gate and is fixed in the on state.

In the replica circuit RP12, the input node of the inverter IP1 receives the gate voltage VP1, and an output signal of the inverter IP1 is supplied to the gate of the P-channel MOS transistor P4 via the inverter IP2. An output signal of the inverter IP1 is supplied to the gate of the N-channel MOS transistor QS2.

In the case where the gate voltage VP1 is lower than the threshold voltage VTHP of the inverter IP1, an output signal of the inverter IP1 becomes the "H" level, an output signal of the inverter IP2 becomes the "L" level, and both of the transistors QS2 and P4 are turned on. In the case where the gate voltage VP1 is higher than the threshold voltage VTHP of the inverter IP1, an output signal of the inverter IP1 becomes the "L" level, and an output signal of the inverter IP2 becomes the "H" level, and both of the transistors QS2 and P4 are turned off.

In the replica circuit RP2, the input node of the inverter IN1 receives the gate voltage VN1, and an output signal of the inverter IN1 is supplied to the gate of the N-channel MOS transistor Q4 via the inverter IN2. An output signal of the inverter IN1 is supplied to the gate of the P-channel MOS transistor PS2.

In the case where the gate voltage VN1 is lower than the threshold voltage VTHN of the inverter IN1, an output signal of the inverter IN1 becomes the "H" level, an output signal of the inverter IN2 becomes the "L" level, and both of the transistors PS2 and Q4 are turned off. In the case where the gate voltage VN1 is higher than the threshold voltage VTHN of the inverter IN1, an output signal of the inverter IN1 becomes the "L" level, an output signal of the inverter IN2 becomes the "H" level, and both of the transistors PS2 and Q4 are turned on.

In the replica circuit RP3, the input node of the inverter IP1 receives the gate voltage VP2, and an output signal of the inverter IP1 is supplied to the gate of the P-channel MOS transistor P4 via the inverter IP2. An output signal of the inverter IP1 is supplied to the gate of the N-channel MOS transistor QS3.

In the case where the gate voltage VP2 is lower than the threshold voltage VTHP of the inverter IP1, an output signal of the inverter IP1 becomes the "H" level, an output signal of the inverter IP2 becomes the "L" level, and both of the transistors QS3 and P4 are turned on. In the case where the gate voltage VP2 is higher than the threshold voltage VTHP of the inverter IP1, an output signal of the inverter IP1 becomes the "L" level, an output signal of the inverter IP2 becomes the "H" level, and both of the transistors QS3 and P4 are turned off.

In the replica circuit RP3, the input node of the inverter IN1 receives the gate voltage VN2, and an output signal of the inverter IN2 is supplied to the gate of the N-channel MOS transistor Q4 via the inverter IN2. An output signal of the inverter IN1 is supplied to the gate of the P-channel MOS transistor PS3.

In the case where the gate voltage VN2 is lower than the threshold voltage VTHN of the inverter IN1, an output signal of the inverter IN1 becomes the "H" level, an output signal of the inverter IN2 becomes the "L" level, and both of the transistors PS3 and Q4 are turned off. In the case where the gate voltage VN2 is higher than the threshold voltage VTHN of the inverter IN1, an output signal of the inverter IN1 becomes the "L" level, an output signal of the inverter IN2 becomes the "H" level, and both of the transistors PS3 and Q4 are turned on.

Next, the operation of the semiconductor device will be described. In the case where the output voltage VFP1 of the replica circuit RP1 becomes equal to the reference voltage VRP, the inverter IP1 of the replica circuit RP2 detects that the gate voltage VP1 is not the lowest voltage, and turns off the transistors P4 and QS2. As a result, the current of the constant current source CA is interrupted, application of the ground voltage VSS to the negative-side power supply node of the operational amplifier AP2 is stopped, and the gate voltage VP2 as the output voltage of the operational amplifier AP2 becomes the highest voltage. When the gate voltage VP2 becomes the highest voltage, the inverter IP1 of the replica circuit RP3 turns off the transistors P4 and QS3. As a result, the current of the constant current source CA is interrupted, application of the ground voltage VSS to the negative-side power supply node of the operational amplifier AP3 is stopped, and the gate voltage VP3 as the output voltage of the operational amplifier AP3 becomes the highest voltage.

Similarly, in the case where the output voltage VFN1 of the replica circuit RP1 becomes equal to the reference voltage VRP, the inverter IN1 of the replica circuit RP2 detects that the gate voltage VN1 is not the highest voltage, and turns off the transistors Q4 and PS2. As a result, the current of the constant current source CB is interrupted, application of the power supply voltage VDD to the positive-side power supply node of the operational amplifier AN2 is stopped, and the gate voltage VN2 as the output voltage of the operational amplifier AN2 becomes the lowest voltage. When the gate voltage VN2 becomes the lowest voltage, the inverter IN1 of the replica circuit RP3 turns off the transistors Q4 and PS3. As a result, the current of the constant current source CB is interrupted, application of the power supply voltage VDD to the positive-side power supply node of the operational amplifier AN3 is stopped, and the gate voltage VN3 as the output voltage of the operational amplifier AN3 becomes the lowest voltage. The other operation is similar to that of the third embodiment, and its description will not be repeated.

In the fifth embodiment, the effect similar to that of the first embodiment is obtained. In addition, since through current of the replica circuit RP and through current of the operational amplifiers AP and AN, which does not exert an influence on the adjustment of the output impedances Zp and Zn can be interrupted at the same time, power consumption can be further reduced as compared with that of the third embodiment.

Sixth Embodiment

Figure 17:
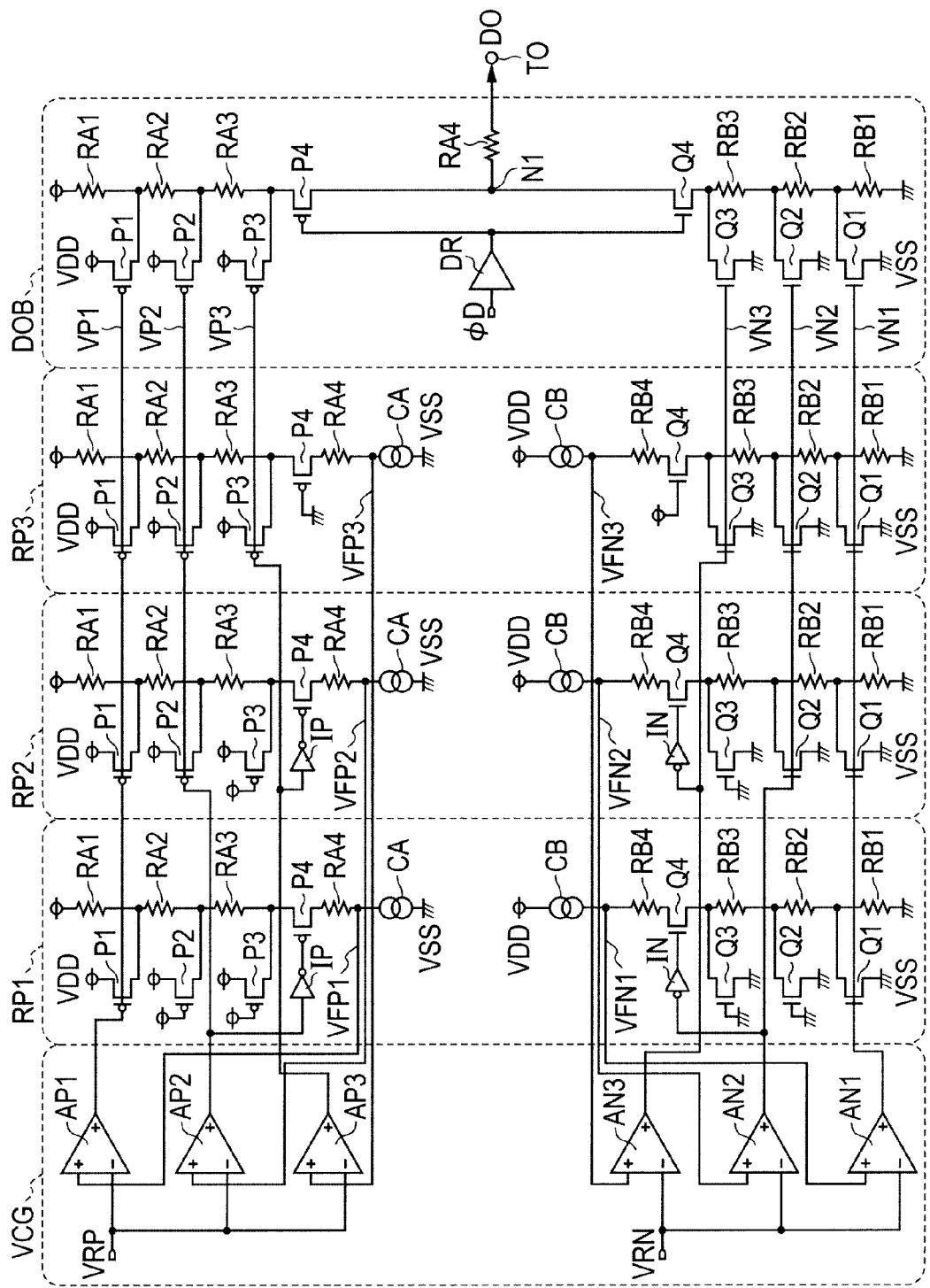
FIG. 17 is a circuit diagram illustrating a configuration of a semiconductor device according to a sixth embodiment of the invention.

FIG. 17 is a circuit diagram showing a main part of a semiconductor device according to a sixth embodiment of the invention and is compared to FIG. 1. The semiconductor device of FIG. 17 is different from the semiconductor device of FIG. 1 with respect to the point that the inverters IP and IN are added to each of the replica circuits RP1 and RP2.

In the replica circuit RP1, the input node of the inverter IP receives the gate voltage VP2, and an output signal of the inverter IP is supplied to the gate of the P-channel MOS transistor P4. In the case where the gate voltage VP2 is lower than the threshold voltage VTHP of the inverter IP, an output signal of the inverter IP becomes the "H" level, and the P-channel MOS transistor P4 is turned off. In the case where the gate voltage VP2 is higher than the threshold voltage VTHP of the inverter IP, an output signal of the inverter IP becomes the "L" level, and the P-channel MOS transistor P4 is turned on.

The input node of the inverter IN receives the gate voltage VN2, and an output signal of the inverter IN is supplied to the gate of the N-channel MOS transistor Q4. In the case where the gate voltage VN2 is lower than the threshold voltage VTHN of the inverter IN, an output signal of the inverter IN becomes the "H" level, and the N-channel MOS transistor Q4 is turned on. In the case where the gate voltage VN2 is higher than the threshold voltage VTHN of the inverter IN, an output signal of the inverter IN becomes the "L" level, and the N-channel MOS transistor Q4 is turned off.

In the replica circuit RP2, the input node of the inverter IP receives the gate voltage VP3, and an output signal of the inverter IP is supplied to the gate of the P-channel MOS transistor P4. In the case where the gate voltage VP3 is lower than the threshold voltage VTHP of the inverter IP, an output signal of the inverter IP becomes the "H" level, and the P-channel MOS transistor P4 is turned off. In the case where the gate voltage VP3 is higher than the threshold voltage VTHP of the inverter IP, an output signal of the inverter IP becomes the "L" level, and the P-channel MOS transistor P4 is turned on.

The input node of the inverter IN receives the gate voltage VN3, and an output signal of the inverter IN is supplied to the gate of the N-channel MOS transistor Q4. In the case where the gate voltage VN3 is lower than the threshold voltage VTHN of the inverter IN, an output signal of the inverter IN becomes the "H" level, and the N-channel MOS transistor Q4 is turned on. In the case where the gate voltage VN3 is higher than the threshold voltage VTHN of the inverter IN, an output signal of the inverter IN becomes the "L" level, and the N-channel MOS transistor Q4 is turned off.

Next, the operation of the semiconductor device will be described. In the case where the replica circuit RP3 becomes equal to the reference voltage VRP, the inverter IP of the replica circuit RP2 detects that the gate voltage VP3 is not the highest voltage, and turns off the P-channel MOS transistor P4 in the replica circuit RP2 to interrupt the constant current source CA.

When the current of the constant current source CA is interrupted, the output voltage VFP2 of the replica circuit RP2 becomes the ground voltage VSS, so that the gate voltage VP2 also becomes the lowest voltage. As a result, the inverter IP of the replica circuit RP1 turns off the P-channel MOS transistor P4 to interrupt the current of the constant current source CA. When the current of the constant current source CA is interrupted, the output voltage VFP1 of the replica circuit RP1 becomes the ground voltage VSS, so that the gate voltage VP1 also becomes the lowest voltage.

Concretely, as illustrated in the upper row in FIG. 11, when the combined resistance value of the resistance elements RA1 to RA4 and the P-channel MOS transistor P4 is higher than a predetermined value and the combined resistance value of the resistance elements RA2 to RA4 and the P-channel MOS transistor P4 is lower than the predetermined value, the gate voltage VP1 becomes the intermediate voltage, and both of the gate voltages VP2 and VP3 become the highest voltage. As a result, in each of the replica circuits RP1 and RP2, the output signal of the inverter IP becomes the "L" level, the P-channel MOS transistor P4 is turned on, and the output voltages VFP1 to VFP3 of the replica circuits RP1 to RP3 become the reference voltage VRP.

The drain current of the P-channel MOS transistor P1 is adjusted to a proper value, the P-channel MOS transistors P2 and P3 are turned off, and the combined resistance value of the resistance elements RA1 to RA4 and the P-channel MOS transistors P1 to P4 of the output buffer DOB is adjusted to a predetermined value.

As illustrated in the intermediate row in FIG. 18, when the combined resistance value of the resistance elements RA2 to RA4 and the P-channel MOS transistor P4 is higher than a predetermined value and the combined resistance value of the resistance elements RA3 and RA4 and the P-channel MOS transistor P4 is lower than the predetermined value, the gate voltage VP1 becomes the lowest voltage, the gate voltage VP2 becomes the intermediate voltage, and the gate voltage VP3 becomes the highest voltage. As a result, in the replica circuit RP1, an output signal of the inverter IP becomes the "H" level, the P-channel MOS transistor P4 is turned off, and the output voltage VFP1 becomes the ground voltage VSS. In the replica circuit RP2, an output signal of the inverter IP becomes the "L" level, the P-channel MOS transistor P4 is turned on, and the output voltage VFP2 of the replica circuit RP2 becomes equal to the reference voltage VRP. Since the P-channel MOS transistor P4 is on in the replica circuit RP3, the output voltage VFP3 of the replica circuit RP3 becomes equal to the reference voltage VRP.

The P-channel MOS transistor P1 is turned on, the drain current of the P-channel MOS transistor P2 is adjusted to a proper value, the P-channel MOS transistor P3 is turned off, and the combined resistance value of the resistance elements RA1 to RA4 and the P-channel MOS transistors P1 to P4 of the output buffer DOB is adjusted to a predetermined value.

As illustrated in the lower row in FIG. 18, when the combined resistance value of the resistance elements RA3 and RA4 and the P-channel MOS transistor P4 is higher than a predetermined value and the combined resistance value of the resistance element RA4 and the P-channel MOS transistor P4 is lower than the predetermined value, both of the gate voltages VP1 and VP2 become lowest voltage, and the gate voltage VP3 becomes the intermediate voltage. As a result, in each of the replica circuits RP1 and RP2, an output signal of the inverter IP becomes the "H" level, the P-channel MOS transistor P4 is turned off, and the output voltages VFP1 and VFP2 become the ground voltage. In the replica circuit RP3, since the P-channel MOS transistor P4 is on, the output voltage VFP3 of the replica circuit RP3 becomes equal to the reference voltage VRP.

The P-channel MOS transistors P1 and P2 are turned on, the drain current of the P-channel MOS transistor P3 is adjusted to a proper value, and the combined resistance value of the resistance elements RA1 to RA4 and the P-channel MOS transistors P1 to P4 in the output buffer DOB is adjusted to a predetermined value.

Similarly, in the case where the output voltage VFN3 of the replica circuit RP3 becomes equal to the reference voltage VRN, the inverter IN of the replica circuit RP2 detects that the gate voltage VN3 is not the lowest voltage, and the N-channel MOS transistor Q4 is turned off to interrupt the current of the constant current source CB. When the current of the constant current source CB is interrupted, the output voltage VN2 also becomes the highest voltage. As a result, the inverter IN of the replica circuit RP1 turns off the N-channel MOS transistor Q4 to interrupt the current of the constant current source CB. When the current of the constant current source CB is interrupted, the output voltage VFN1 of the replica circuit RP1 becomes the power supply voltage VDD, and the gate voltage VN1 also becomes the highest voltage.

Concretely, as illustrated in the upper row in FIG. 19, when the combined resistance value of the resistance elements RB1 to RAB and the N-channel MOS transistor Q4 is higher than a predetermined value and the combined resistance value of the resistance elements RB2 to RB4 and the N-channel MOS transistor Q4 is lower than the predetermined value, the gate voltage VN1 becomes the intermediate voltage, and both of the gate voltages VN2 and VN3 become the lowest voltage. As a result, in each of the replica circuits RP1 and RP2, the output signal of the inverter IN becomes the "H" level, the N-channel MOS transistor Q4 is turned on, and the output voltages VFN1 to VFN3 of the replica circuits RP1 to RP3 become the reference voltage VRN.

The drain current of the N-channel MOS transistor Q1 is adjusted to a proper value, the N-channel MOS transistors Q2 and Q3 are turned off, and the combined resistance value of the resistance elements RB1 to RAB and the N-channel MOS transistors Q1 to Q4 of the output buffer DOB is adjusted to a predetermined value.

As illustrated in the intermediate row in FIG. 19, when the combined resistance value of the resistance elements RB2 to RB4 and the N-channel MOS transistor Q4 is higher than a predetermined value and the combined resistance value of the resistance elements RB3 and RB4 and the N-channel MOS transistor Q4 is lower than the predetermined value, the gate voltage VN1 becomes the highest voltage, the gate voltage VN2 becomes the intermediate voltage, and the gate voltage VN3 becomes the lowest voltage. As a result, in the replica circuit RP1, an output signal of the inverter IP becomes the "L" level, the N-channel MOS transistor Q4 is turned off, and the output voltage VFN1 becomes the power supply voltage VDD.

In the replica circuit RP2, the output signal of the inverter IP becomes the "H" level, the N-channel MOS transistor Q4 is turned on, and the output voltage VFN2 of the replica circuit RP2 becomes equal to the reference voltage VRN. In the replica circuit RP3, the N-channel MOS transistor Q4 is on, so that the output voltage VFN3 of the replica circuit RP3 becomes equal to the reference voltage VRN.

The N-channel MOS transistor Q1 is turned on, the drain current of the N-channel MOS transistor Q2 is adjusted to a proper value, the N-channel MOS transistor Q3 is turned off, and the combined resistance value of the resistance elements RB1 to RB4 and the N-channel MOS transistors Q1 to Q4 in the output buffer DOB is adjusted to a predetermined value.

As illustrated in the lower row in FIG. 19, when the combined resistance value of the resistance elements RB3 and RB4 and the N-channel MOS transistor Q4 is higher than a predetermined value and the combined resistance value of the resistance element RB4 and the N-channel MOS transistor Q4 is lower than the predetermined value, both of the output voltages VN1 and VN2 become the highest voltage, and the gate voltage VN3 becomes the intermediate voltage. As a result, in each of the replica circuits RP1 and RP2, an output signal of the inverter IP becomes the "L" level, the N-channel MOS transistor Q4 is turned off, and the output voltages VFN1 and VFN2 become the power supply voltage VDD. In the replica circuit RP3, since the N-channel MOS transistor Q4 is on, the output voltage VFN3 of the replica circuit RP3 becomes equal to the reference voltage VRN.

The N-channel MOS transistors Q1 and Q2 are turned on, the drain current of the N-channel MOS transistor Q3 is adjusted to a proper value, and the combined resistance value of the resistance elements RB1 to RB4 and the N-channel MOS transistors Q1 to Q4 of the output buffer DOB is adjusted to a predetermined value.

In the sixth embodiment, the effect similar to that of the first embodiment is obtained. In addition, since through current of the replica circuit RP which does not exert an influence on the adjustment of the output impedances Zp and Zn can be interrupted, power consumption can be further reduced as compared with that of the first embodiment.

Seventh Embodiment

Figure 20:
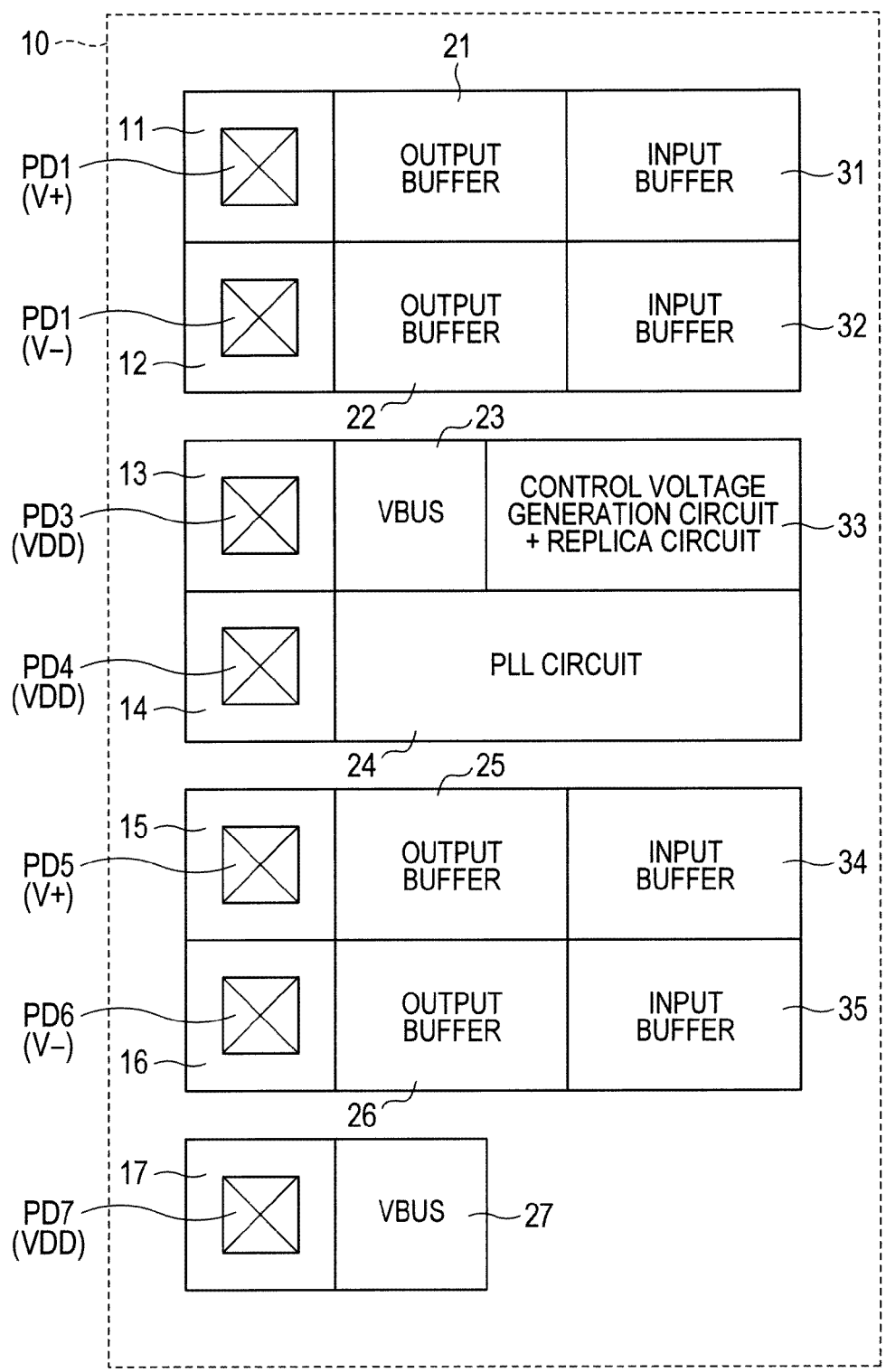
FIG. 20 is a block diagram illustrating the layout of a semiconductor device according to a seventh embodiment of the invention.

FIG. 20 is a block diagram showing a 1a semiconductor device according to a seventh embodiment of the invention. In FIG. 20, the semiconductor device is used in, for example, a port part of a personal computer and has the semiconductor substrate 10. Along one side of the semiconductor substrate 10, seven pads PD1 to PD7 are disposed in one line in the vertical direction of the diagram at predetermined intervals. A first port is formed by the pads PD1 to PD3, and a second port is formed by the pads PD5 to PD7. To the first port or the second port, for example, a mouse is coupled. The pads PD1 and PD2 are used to input/output complementary signals V+ and V−. The pads PD5 and PD6 are used to input/output the complementary signals V+ and V−. To each of the pads PD3, PD4, and PD7, the power supply voltage VDD is output.

The pads PD1 to PD7 are provided in the regions of ESD (Electro-Static Discharge) protection circuits 11 to 17, respectively. The ESD protection circuits 11 to 17 protect internal circuits by discharging static electricity generated in the pads PD to PD7 to the line (not-shown) of the ground voltage VSS.

An output buffer 21 and an input buffer 31 are disposed in order in a region on the right side in the diagram of the ESD protection circuit 11, and an output buffer 22 and an input buffer 32 are disposed in order in a region on the right side in the diagram of the ESD protection circuit 12. An output buffer 25 and an input buffer 34 are disposed in order in a region on the right side in the diagram of the ESD protection circuit 15, and an output buffer 26 and an input buffer 35 are disposed in order in a region on the right side in the diagram of the ESD protection circuit 16.

Each of the output buffers 21, 22, 25, and 26 includes the full-speed output buffer DOB shown in FIG. 1 and the high-speed output buffer DOB0 shown in FIG. 7. The output buffer 21 outputs the signal V+ to the pad PD1 in response to an internal signal φV+. The output buffer 22 outputs the signal V− to the pad PD2 in response to an internal signal φV−. The output buffer 25 outputs the signal V+ to the pad PD5 in response to the internal signal φV+. The output buffer 26 outputs the signal V− to the pad PD6 in response to the internal signal φV−.

Each of the input buffers 31, 32, 34, and 35 includes the full-speed input buffer and the high-speed input buffer. The input buffer 31 generates the internal signal φV+ in response to an external signal V+ supplied to the pad PD1. The input buffer 32 generates the internal signal φV− in response to an external signal V− supplied to the pad PD2. The input buffer 34 generates the internal signal φV+ in response to the external signal V+ supplied to the pad PD5. The input buffer 35 generates the internal signal φV− in response to the external signal V− supplied to the pad PD6.

A power supply detection circuit (VBUS) 23 and a control voltage generation circuit+replica circuit 33 are disposed in order in a region on the right side in the diagram of the ESD protection circuit 13, and a PLL (Phase Locked Loop) circuit 24 is disposed in a region on the right side in the diagram of the ESD protection circuit 14. A power supply detection circuit (VBUS) 27 is disposed in a region on the right side in the diagram of the ESD protection circuit 17.

The power supply detection circuit 23 generates a power supply detection signal in response to output of the power supply voltage VDD to the pad PD3 in the first port. The power supply detection circuit 27 generates a power supply detection signal in response to output of the power supply voltage VDD to the pad PD7 in the second port.

The control voltage generation circuit+replica circuit 33 includes the control voltage generation circuit VCG and the replica circuits RP1 to RP3 illustrated in FIG. 1 and supplies the gate voltages VP1 to VP3 and VN1 to VN3 to the full-speed output buffers DOB in the output buffers 21, 22, 25, and 26. The PLL circuit 24 generates an internal clock signal synchronized with an external clock signal.

In the seventh embodiment, one control voltage generation circuit 30 replica circuit 33 is provided for the plurality of output buffers 21, 22, 25, and 26, so that layout area can be reduced.

It should be understood that the embodiments disclosed herein are illustrative and not restrictive in all of aspects. The scope of the present invention is defined by the scope of claims rather than by the above description, and all changes in the claims or equivalents are intended to be included.

What is claimed is:

1. A semiconductor device comprising:
a variable resistance circuit;
first to M-th replica circuits (where M is an integer of 2 or larger); and
operational amplifiers each provided in correspondence with each of the replica circuits,
wherein each of the variable resistance circuit and the first to M-th replica circuits includes:
first to M-th resistance elements coupled in series between a first voltage line and a predetermined node; and
first to M-th transistors provided in correspondence with the first to M-th resistance elements, respectively, and each coupled between the first voltage line and an electrode on the predetermined node side of a corresponding resistance element,
wherein each of the first to M-th replica circuits further includes a constant current source coupled between the predetermined node and a second voltage line and passing predetermined constant current,
wherein each of (m+1)th to M-th transistors of the m-th replica circuit (where m is any integer from 1 to M−1) is fixed in a non-conductive state, gates of a plurality of k-th transistors which are not fixed in the non-conductive state out of k-th transistors (where k is any integer from 1 to M) of M+1 pieces included in the variable resistance circuit and the first to M-th replica circuits are coupled to one another, and
wherein the operational amplifier controls the gate voltage of the k-th transistor of a corresponding to k-th replica circuit so that voltage of the predetermined node of the corresponding k-th replica circuit becomes predetermined reference voltage.

2. The semiconductor device according to claim 1,
wherein each of the first to M-th replica circuits further includes an (M+1)th transistor coupled in series to the constant current source between the first voltage line and the second voltage line,
wherein the (M+1)th transistor in the first replica circuit is fixed in a conductive state, and
wherein in the case where the m-th transistor in the m-th replica circuit is not set in a conductive state, the (M+1)th transistor of the (m+1)th replica circuit is set to a non-conductive state.

3. The semiconductor device according to claim 2, wherein in the case where the m-th transistor in the m-th replica circuit is not set in the conductive state, an operational amplifier corresponding to the (m+1)th replica circuit is set in an inactive state.

4. The semiconductor device according to claim 1,
wherein each of the first to M-th replica circuits further includes an (M+1)th transistor coupled in series to the constant current source between the first voltage line and the second voltage line,
wherein the (M+1)th transistor in the M-th replica circuit is fixed in a conductive state, and
wherein in the case where the (m+1)th transistor in the (m+1)th replica circuit is in a conductive state, the (M+1)th transistor in the m-th replica circuit is set to a non-conductive state.

5. A semiconductor device comprising:
an output buffer;
an output terminal;
first to M-th replica circuits (where M is an integer of 2 or larger); and
operational amplifiers each provided in correspondence with each of the replica circuits,
wherein each of the output buffer and the first to M-th replica circuits includes:
 first to M-th resistance elements coupled in series between a first voltage line and a first node;
 first to M-th transistors provided in correspondence with the first to M-th resistance elements, respectively, and each coupled between the first voltage line and an electrode on the predetermined node side of a corresponding resistance element; and
 an (M+1)th transistor and an (M+1)th resistance element coupled in series between the first and second nodes,
wherein the second node of the output buffer is coupled to the output terminal,
wherein the (M+1)th transistor of the output buffer enters a conductive state or a non-conductive state in response to an internal signal,
wherein the (M+1)th transistors in the first to M-th replica circuits are fixed in a conductive state,
wherein each of the first to M-th replica circuits further includes a first constant current source coupled between the second node and a second voltage line and passing predetermined constant current,
wherein each of (m+1)th to M-th transistors of the m-th replica circuit (where m is any integer from 1 to M−1) is fixed in a non-conductive state, gates of a plurality of k-th transistors which are not fixed in the non-conductive state out of k-th transistors (where k is any integer from 1 to M) of M+1 pieces included in the variable resistance circuit and the first to M-th replica circuits are coupled to one another, and
wherein the operational amplifier controls the gate voltage of the k-th transistor of a corresponding k-th replica circuit so that voltage of the second node of the corresponding k-th replica circuit becomes predetermined reference voltage.

6. The semiconductor device according to claim 5,
wherein two sets of the output buffers, the first to M-th replica circuits, and operational amplifiers provided in correspondence with the replica circuits are provided,
wherein in one of the sets, the first voltage is power supply voltage, the second voltage is ground voltage, and each of the first to (M+1)th transistors is a P-channel MOS transistor,
wherein in the other set, the first voltage is ground voltage, the second voltage is power supply voltage, and each of the first to (M+1)th transistors is an N-channel MOS transistor, and
wherein the (M+1)th resistance element of the output buffer is shared by the two sets.

7. The semiconductor device according to claim 5,
wherein the (M+1)th transistor in the output buffer is fixed in a conductive state, and
wherein the output buffer further includes:
 a switching element whose one electrode is coupled to the second node and which enters a conductive state or a non-conductive state in response to an internal signal; and
 a second constant current source coupled between the other electrode of the switching element and a line of second voltage and passing the predetermined constant current.

8. The semiconductor device according to claim 7, wherein the first voltage is ground voltage, and the second voltage is power supply voltage.

* * * * *

UNITED STATES PATENT AND TRADEMARK OFFICE
CERTIFICATE OF CORRECTION

PATENT NO. : 8,350,609 B2
APPLICATION NO. : 13/369063
DATED : January 8, 2013
INVENTOR(S) : Masahiro Araki et al.

It is certified that error appears in the above-identified patent and that said Letters Patent is hereby corrected as shown below:

Title page, Item (30) Foreign Application Priority Data should read
-- March 7, 2011 -- rather than March 20, 2011.

Signed and Sealed this
Third Day of September, 2013

Teresa Stanek Rea
*Acting Director of the United States Patent and Trademark Office*